US009754865B2

(12) United States Patent
Yamashita et al.

(10) Patent No.: US 9,754,865 B2
(45) Date of Patent: Sep. 5, 2017

(54) SEMICONDUCTOR DEVICE AND METHOD FOR MANUFACTURING THE SAME

(71) Applicant: Renesas Electronics Corporation, Kawasaki-shi, Kanagawa (JP)

(72) Inventors: Takanori Yamashita, Kanagawa (JP); Toshinori Kiyohara, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/304,949

(22) Filed: Jun. 15, 2014

(65) Prior Publication Data

US 2014/0374890 A1  Dec. 25, 2014

(30) Foreign Application Priority Data

Jun. 25, 2013 (JP) .................. 2013-133174

(51) Int. Cl.
*H01L 23/495* (2006.01)
*H01L 23/64* (2006.01)
(Continued)

(52) U.S. Cl.
CPC .... *H01L 23/49575* (2013.01); *H01L 23/4952* (2013.01); *H01L 23/5227* (2013.01); *H01L 23/645* (2013.01); *H01L 24/06* (2013.01); *H01L 24/49* (2013.01); *H01L 24/85* (2013.01); *H01L 24/92* (2013.01); *H01L 24/97* (2013.01); *H04L 25/0266* (2013.01); *H01F 2019/085* (2013.01);
(Continued)

(58) Field of Classification Search
CPC ........... H01L 23/49575; H01L 23/4952; H01L 23/5227; H01L 24/06; H01L 23/645; H01L 24/49; H01L 2224/48247; H01L 2224/73265; H01L 2224/48227; H01L 2224/49175; H01L 2924/181
See application file for complete search history.

(56) References Cited

U.S. PATENT DOCUMENTS 8,350,357 B2    1/2013  Furumiya et al.
8,441,325 B2 *  5/2013  Callahan et al. .......... 333/24 R
(Continued)

FOREIGN PATENT DOCUMENTS

JP      04-258157 A      9/1992
JP      2009-302418 A    12/2009
(Continued)

OTHER PUBLICATIONS

Extended European Search Report issued May 12, 2015, in European Patent Application No. EP14170909.7.
(Continued)

*Primary Examiner* — Khiem D Nguyen
(74) *Attorney, Agent, or Firm* — Shapiro, Gabor and Rosenberger, PLLC

(57) ABSTRACT

In an SOP1 having a semiconductor chip and another semiconductor chip, in wire coupling between the chips, a withstand voltage can be secured by setting an inter-wire distance between a wire in a first wire group that is closest to a second wire group and a wire in the second wire group that is closest to the first wire group to be larger than an inter-wire distance between any wires in the first wire group and the second wire group, which makes it possible to attain improvement of reliability of the SOP1.

20 Claims, 20 Drawing Sheets

(51) Int. Cl.
  *H04L 25/02*   (2006.01)
  *H01L 23/522*  (2006.01)
  *H01L 23/31*       (2006.01)
  *H01L 21/56*       (2006.01)
  *H01L 23/00*       (2006.01)
  *H01F 19/08*       (2006.01)

(52) U.S. Cl.
  CPC ........ *H01L 21/565* (2013.01); *H01L 23/3107* (2013.01); *H01L 23/49503* (2013.01); *H01L 24/29* (2013.01); *H01L 24/32* (2013.01); *H01L 24/73* (2013.01); *H01L 24/78* (2013.01); *H01L 24/83* (2013.01); *H01L 2224/04042* (2013.01); *H01L 2224/05553* (2013.01); *H01L 2224/05554* (2013.01); *H01L 2224/0612* (2013.01); *H01L 2224/06164* (2013.01); *H01L 2224/27013* (2013.01); *H01L 2224/29294* (2013.01); *H01L 2224/29339* (2013.01); *H01L 2224/32245* (2013.01); *H01L 2224/45147* (2013.01); *H01L 2224/48091* (2013.01); *H01L 2224/48137* (2013.01); *H01L 2224/48247* (2013.01); *H01L 2224/48257* (2013.01); *H01L 2224/48464* (2013.01); *H01L 2224/48477* (2013.01); *H01L 2224/48479* (2013.01); *H01L 2224/49175* (2013.01); *H01L 2224/49177* (2013.01); *H01L 2224/73265* (2013.01); *H01L 2224/78301* (2013.01); *H01L 2224/78705* (2013.01); *H01L 2224/83192* (2013.01); *H01L 2224/85051* (2013.01); *H01L 2224/85181* (2013.01); *H01L 2224/85205* (2013.01); *H01L 2224/85986* (2013.01); *H01L 2224/92247* (2013.01); *H01L 2224/97* (2013.01); *H01L 2924/00014* (2013.01); *H01L 2924/12041* (2013.01); *H01L 2924/15747* (2013.01); *H01L 2924/181* (2013.01); *H01L 2924/19042* (2013.01); *H01L 2924/19104* (2013.01)

(56) References Cited

U.S. PATENT DOCUMENTS

| | | | |
|---|---|---|---|
| 8,987,063 B2 | 3/2015 | Harata et al. | |
| 2005/0218489 A1* | 10/2005 | Satou | H01L 23/49575 257/678 |
| 2006/0113664 A1* | 6/2006 | Shiraishi et al. | 257/723 |
| 2007/0216377 A1* | 9/2007 | Yoshimura | H04L 25/0266 323/250 |
| 2009/0309688 A1 | 12/2009 | Kawano | |
| 2010/0230782 A1* | 9/2010 | Uchida | H01L 25/0655 257/531 |
| 2012/0238056 A1* | 9/2012 | Numazaki | H01L 21/565 438/107 |

FOREIGN PATENT DOCUMENTS

| JP | 2010-251641 A | 11/2010 |
|---|---|---|
| JP | 2012-169417 A | 9/2012 |

OTHER PUBLICATIONS

Office Action, issued Dec. 20, 2016, in Japanese Application No. 2013-133174.

* cited by examiner

FIG. 9
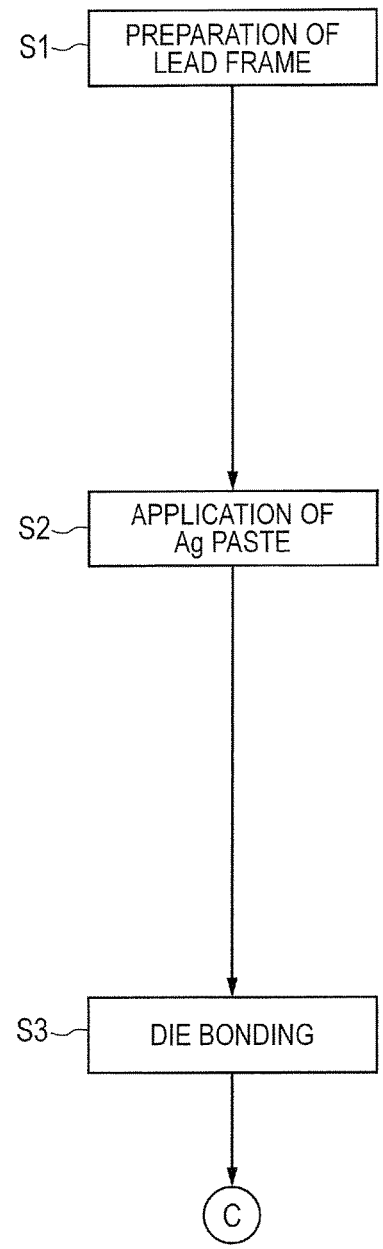
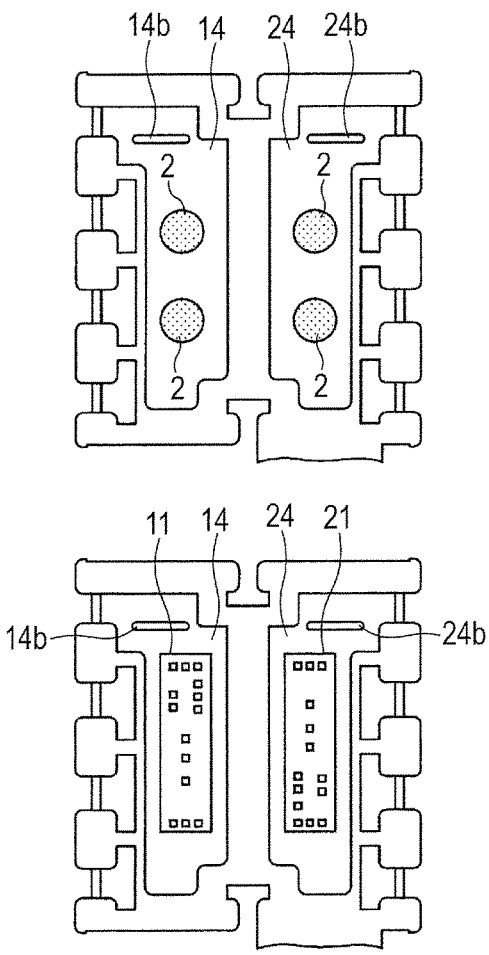

SEMICONDUCTOR DEVICE AND METHOD FOR MANUFACTURING THE SAME

CROSS-REFERENCE TO RELATED APPLICATION

The disclosure of Japanese Patent Application No. 2013-133174 filed on Jun. 25, 2013 including the application, drawings and abstract is incorporated herein by reference in its entirety.

BACKGROUND

The present invention relates to a semiconductor device and its manufacturing technology, for example, a technology that is effective when being applied to a semiconductor device that integrates multiple semiconductor chips into a single package.

A structure of a semiconductor device that includes a semiconductor chip over which an inductor comprised of a spiral electric conduction pattern is formed is disclosed, for example, in Japanese Unexamined Patent Application Publication No. 2009-302418.

SUMMARY

For example, in control of a motor, etc., in the case where electric signals are transmitted between two circuits such that potentials of electric signals inputted thereinto are mutually different, transmission is often performed through a photocoupler. The photocoupler includes a light emitting device such as a light emitting diode and a photodetector such as a phototransistor, and transfers an electric signal by converting the electric signal inputted thereinto into light with the light emitting device, receiving this light with the photodetector, and subsequently converting it into an electric signal again.

However, since the photocoupler includes the light emitting device and the photodetector, it is difficult to miniaturize it. Moreover, a photocoupler has a tendency that its followability declines when a frequency of the electric signal becomes higher.

Therefore, in recent years, as a technology of solving these problems, for example, a technology of transmitting an electric signal by performing inductive coupling of two inductors has been developed.

The inventors of this application have considered structure in which multiple (two) semiconductor chips each having a transmission part and a reception part, respectively, are coupled together electrically with wires, and are integrated into a single package using this technology. This is a structure in which two inductors in the respective semiconductor chips are formed, and a first communication part for performing transmission between two chips, i.e., from one semiconductor chip to the other semiconductor chip and a second communication part for performing transmission between the two chips, i.e., from the other semiconductor chip to the one semiconductor chip are formed.

In this structure, when power supply voltages differ largely between the first communication part side and the second communication part side, it is required to secure withstand voltages between mutual wires, and if these withstand voltages are not secured, there is a possibility of causing electric short circuit.

An object of embodiments disclosed in this application is to provide a technology that can improve reliability of the semiconductor device.

Other problems and new features will become clear from description and accompanying drawings of this specification.

A semiconductor device according to one embodiment has: a first semiconductor chip having a first transmission part and a first reception part; a second semiconductor chip having a second transmission part and a second reception part; a first chip mounting part; a second chip mounting part; a first suspension lead; a second suspension lead; multiple first leads; multiple second leads; a first wire group; a second wire group; a third wire group; a fourth wire group; and a sealing body. Moreover, in the above-mentioned semiconductor device, both in plan view and in a first direction of the sealing body, an inter-wire distance between a wire in the first wire group that is the closest to the second wire group and a wire in the second wire group that is the closest to the first wire group is larger than any inter-wire distances in the first wire group and in the second wire group.

Moreover, a method for manufacturing a semiconductor device according to one embodiment includes a process of preparing a lead frame that has the first chip mounting part, the second chip mounting part, the multiple first leads, and the multiple second leads, and a process of mounting the first semiconductor chip over the above-mentioned first chip mounting part and mounting the second semiconductor chip over the second chip mounting part. Furthermore, the above-mentioned method for manufacturing a semiconductor device includes the steps of: electrically coupling some of respective multiple pads of the above-mentioned first semiconductor chip and the above-mentioned second semiconductor chip with wires; electrically coupling some of the multiple pads of the above-mentioned first semiconductor chip and the above-mentioned first leads with wires; and electrically coupling some of the multiple pads of the above-mentioned second semiconductor chip and the above-mentioned second leads with wires. Moreover, the above-mentioned method for manufacturing a semiconductor device includes the steps of: coupling multiple first pads of the above-mentioned first semiconductor chip and multiple fourth pads of the above-mentioned second semiconductor chip with multiple wires; and coupling multiple second pads of the above-mentioned first semiconductor chip and multiple third pads of the above-mentioned second semiconductor chip with multiple wires. Furthermore, in the above-mentioned method for manufacturing a semiconductor device, when wire coupling is performed in the above-mentioned first wire group or the above-mentioned second wire group, it is performed so that an inter-wire distance between a wire that is closest to the above-mentioned second wire group among the above-mentioned first wire group and a wire that is closest to the above-mentioned first wire group among the above-mentioned second wire group may become larger than any inter-wire distances in the above-mentioned first wire group and in the above-mentioned second wire group in plan view.

According to the above-mentioned one embodiment, improvement of the reliability of the semiconductor device can be attained.

BRIEF DESCRIPTION OF THE DRAWINGS

FIG. 9 is a flowchart and a plan view showing one example of a principal process in an assembly of the semiconductor device of FIG. 1;

DETAILED DESCRIPTION

In the following embodiments, except for the case when being especially necessary, an explanation of the same or similar portion is not repeated in principle.

Furthermore, in the following embodiments, when it is required for convenience, they are divided into multiple sections or embodiments and are given explanations, they are not mutually unrelated, but are in a relationship where one is a modification, details, a supplementary explanation, etc. of a part or the whole of the other except for the case where it is clearly specified.

Moreover, in the following embodiments, when referring to the number of components (including a quantity, a numerical value, a quantity, a range, etc.), and the like, it shall be understood that the embodiments are not limited to that specific number and a number may be not less than or not more than the specific number except for the case where the number is clearly specified and the case where it is clearly limited to a specific number.

Moreover, in the following embodiments, it goes without saying that the structural element (including an elementary step, etc.) is not necessarily indispensable except for the case where it is clearly indicated, the case where it is theoretically thought that it is clearly indispensable, etc.

Moreover, in the following embodiment, it goes without saying that when describing "is comprised of A," "consist of A," "have A," and "include A," regarding a structural element etc., any component other than it is not excluded except for the case where it is specially specified that it has only A, etc. Similarly, in the following embodiments, when mentioning a shape of a structural element etc., a spatial relationship, etc., what substantially approximates or is similar to its shape, etc. shall be included except for the case where it is clearly specified or the case where it can be thought that it is not so. This also holds for the above-mentioned numerical value, range, etc.

Hereinafter, embodiments will be described in detail based on drawings. Incidentally, in all diagrams for explaining the embodiments, the same sign is given to a component having the same function, and its repeated explanation is omitted. Moreover, in order to make a drawing intelligible, hatching may be attached thereon even if it is a plan view.

Embodiment

Figure 1:
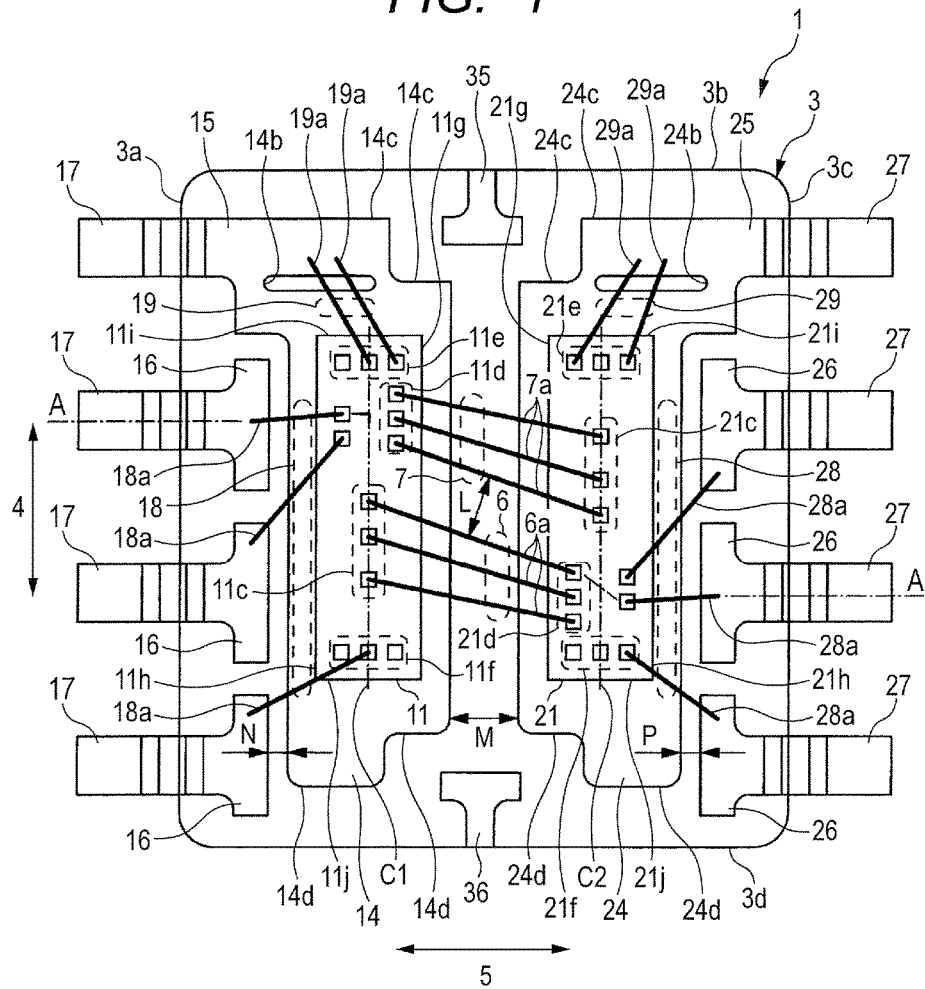
FIG. 1 is a plan view of one example of a structure of a semiconductor device of an embodiment with a sealing body penetrated.
Figure 2:
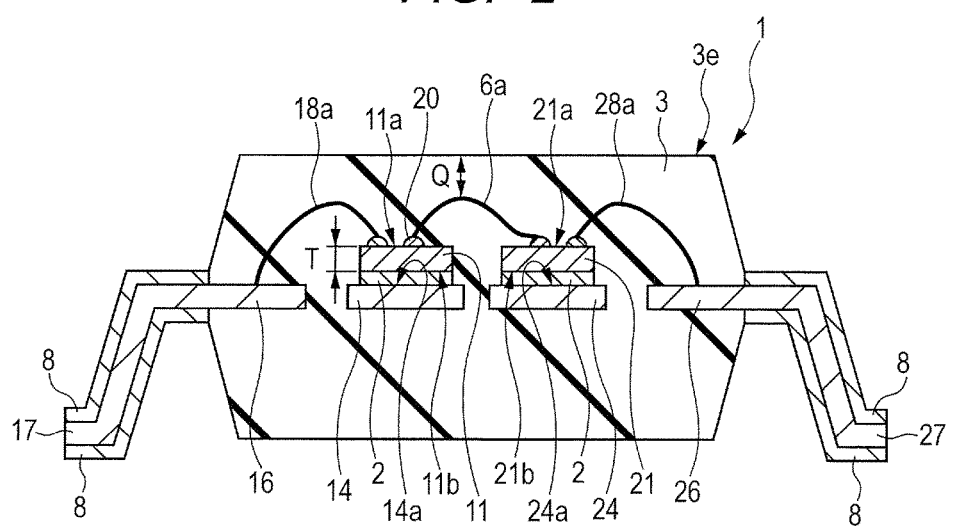
FIG. 2 is a sectional view showing one example of the structure taken along a line A-A of FIG. 1.
Figure 3:
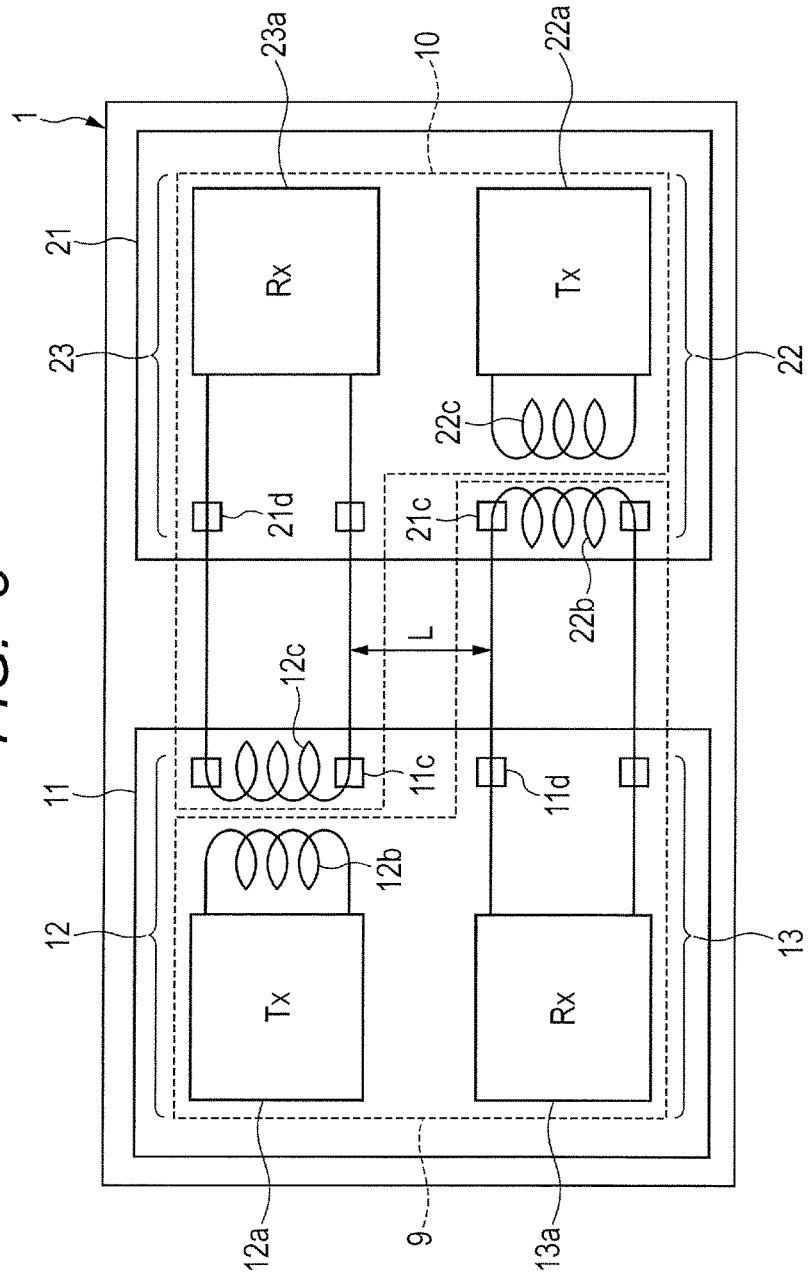
FIG. 3 is a block diagram showing one example of a circuit block of transmission reception parts of a semiconductor device shown in FIG. 1.
Figure 4:
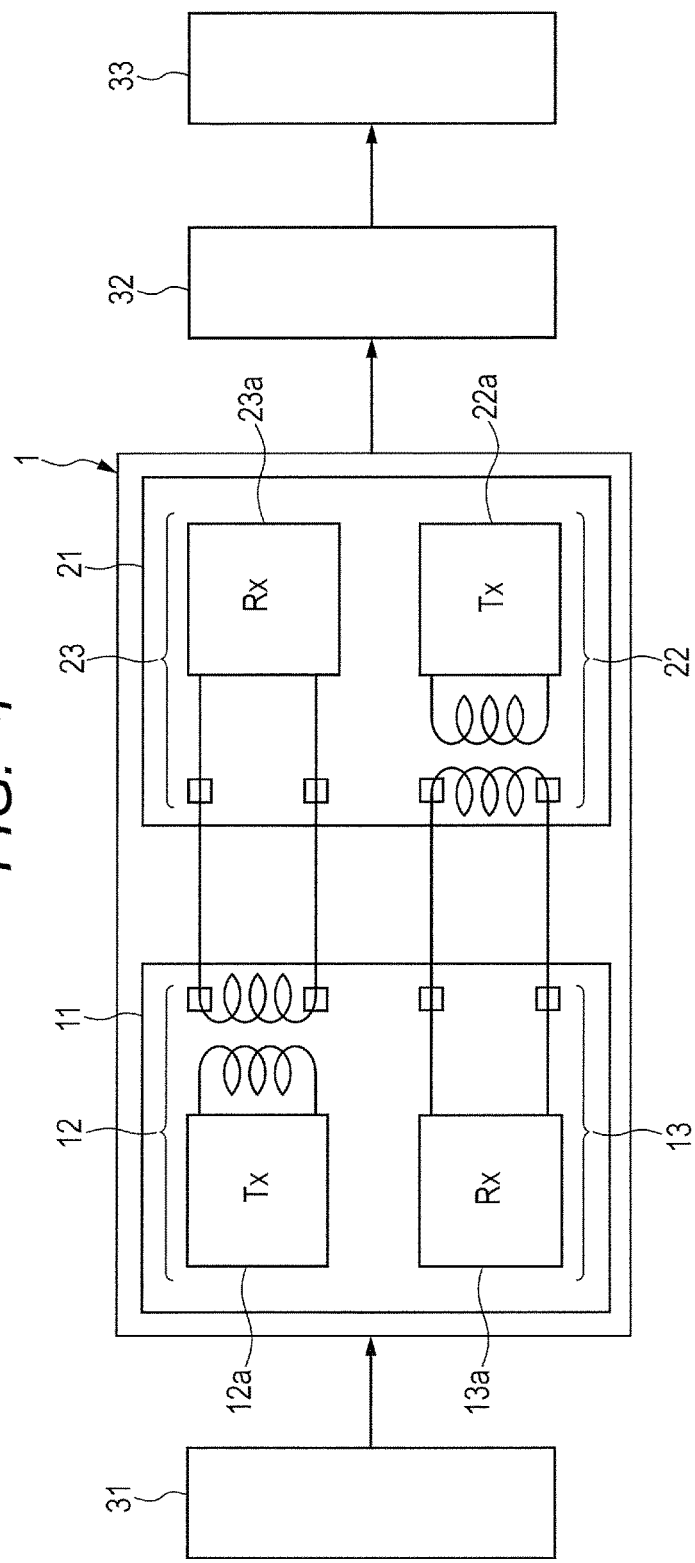
FIG. 4 is a diagram showing one example of a system block using the semiconductor device shown in FIG. 1.
Figure 5:
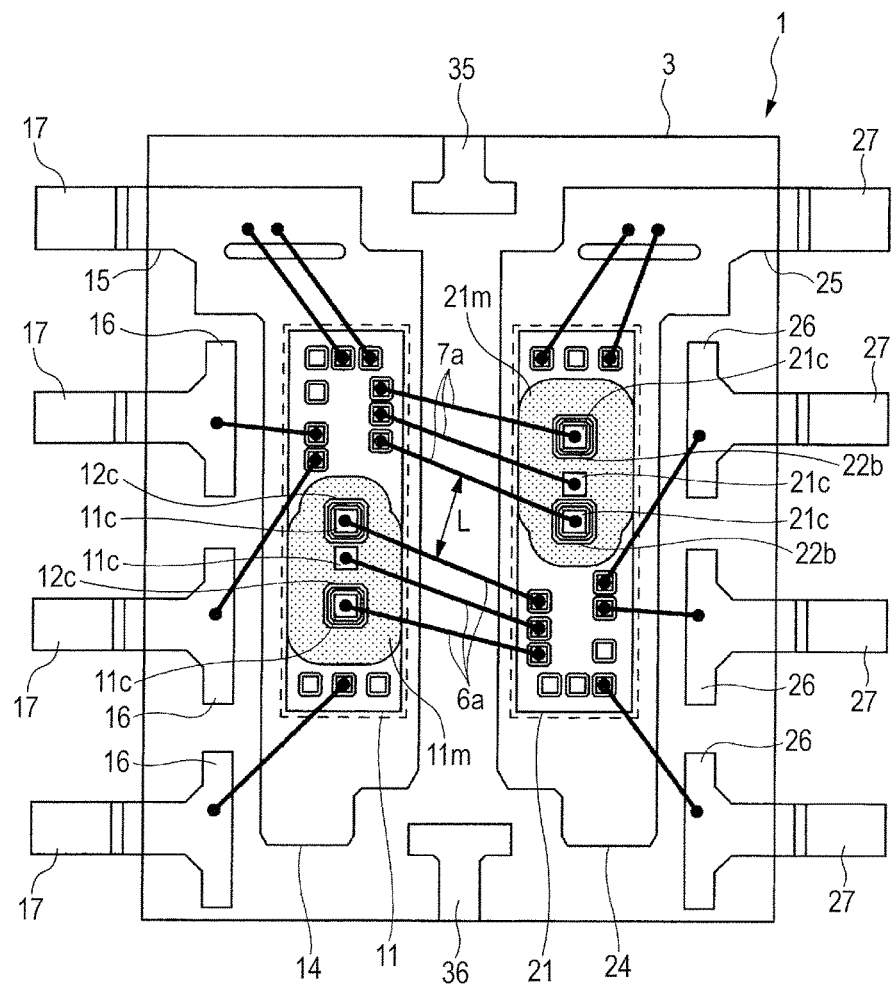
FIG. 5 is a transmission plan view showing one example of an inductor arrangement in each semiconductor chip of the semiconductor device shown in FIG. 1.
Figure 6:
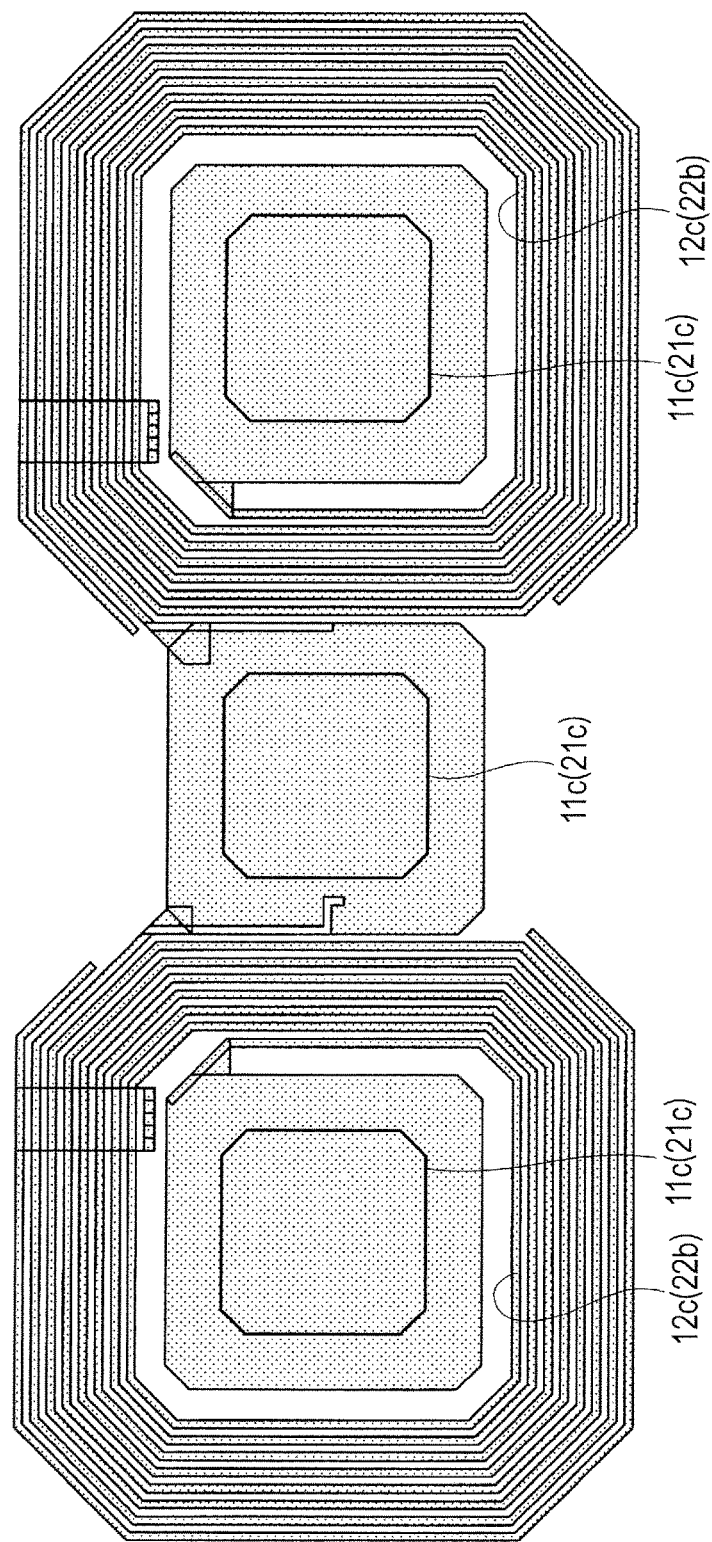
FIG. 6 is a plan view enlarging and showing one example of the inductor arrangement shown in FIG. 5.
Figure 7:
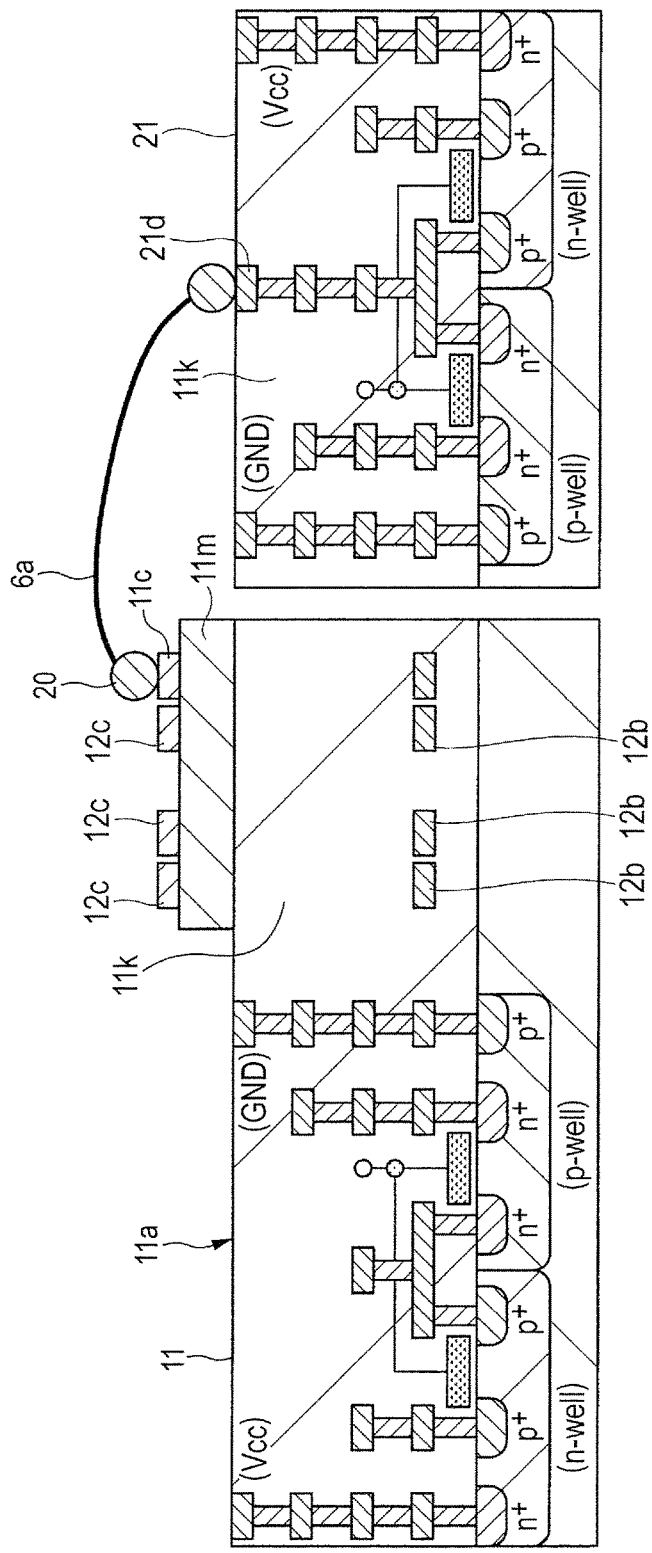
FIG. 7 is a conceptual diagram showing one example of pad heights in two semiconductor chips of the semiconductor device of FIG. 1.
Figure 8:
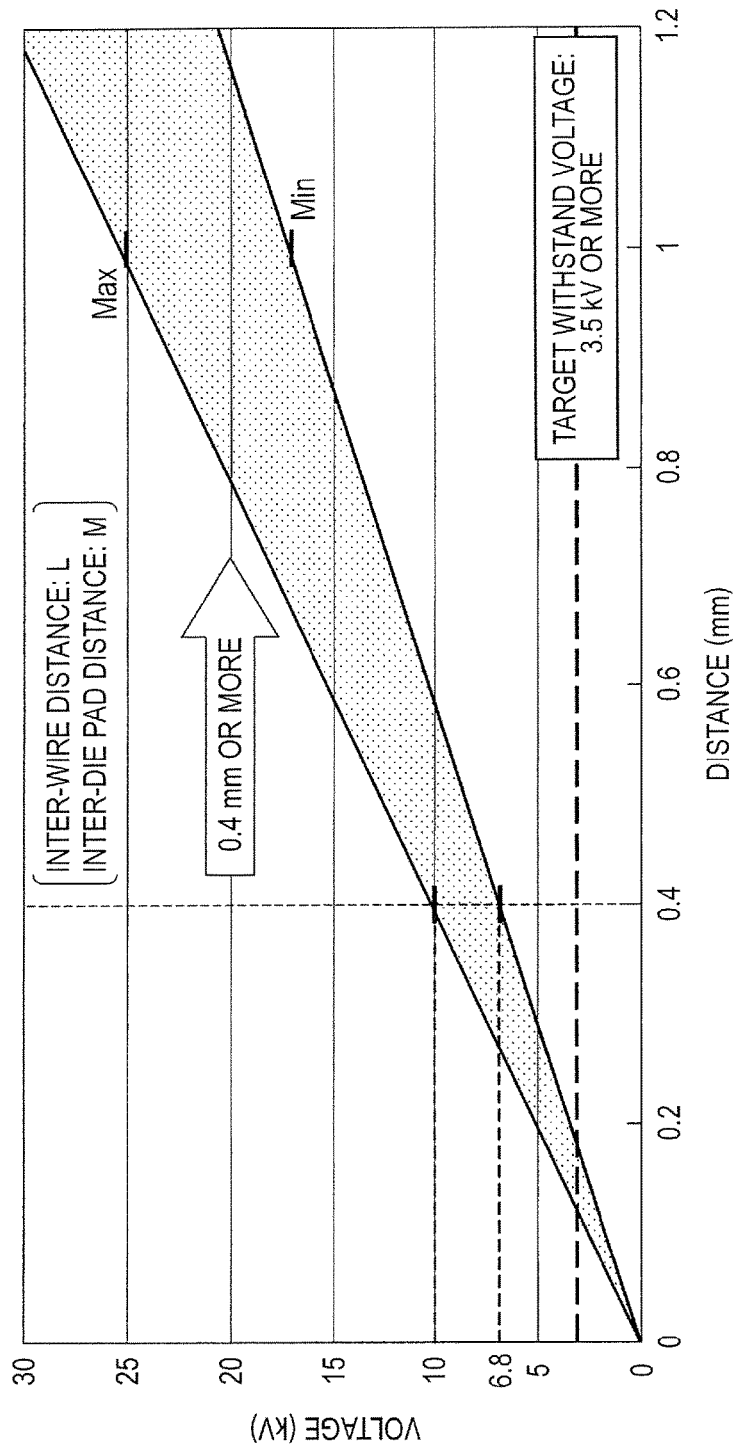
FIG. 8 is a conceptual diagram of withstand voltage showing one example of a relationship between a withstand voltage of sealing resin and a distance in the semiconductor device of FIG. 1.

FIG. 1 is a plan view showing one example of a structure of a semiconductor device according to an embodiment with a sealing body penetrated, FIG. 2 is a sectional view showing one example of the structure taken along the line A-A of FIG. 1, FIG. 3 is a block diagram showing one example of a circuit block of a transmission reception part of the semiconductor device shown in FIG. 1, and FIG. 4 is a diagram showing one example of a system block using the semiconductor device shown in FIG. 1. Moreover, FIG. 5 is a penetration plan view showing one example of an inductor arrangement in each semiconductor chip of the semiconductor device shows in FIG. 1, FIG. 6 is a plan view enlarging and showing one example of the inductor arrangement shown in FIG. 5, FIG. 7 is a conceptual diagram showing one example of pad heights in two semiconductor chips of the semiconductor device of FIG. 1, and FIG. 8 is a withstand voltage conceptual diagram showing one example of a relationship between a withstand voltage and a distance of, sealing resin in the semiconductor device of FIG. 1.

The semiconductor device (semiconductor package) shown in FIG. 1 and FIG. 2 is one over which two semiconductor chips are mounted and integrated into a single package. In each of the two semiconductor chips, a transmission part and reception part for transmitting and receiving a signal between the both chips are formed, the semiconductor chips are electrically coupled with each other using wires, respectively. Moreover, in each of the two semiconductor chips, two inductors (coils) are arranged and the electric signal is transmitted between the inductors without contact between the inductors by bringing the two inductors into inductive coupling in each chip. Here, power supply voltages between the inductors that are brought into the inductive coupling are, for example, about several volts on the low voltage side and about several hundred volts to several thousand volts, which are different largely from each other. The above-mentioned inductors transmit an electric signal in a non-contact state therebetween through an insulating layer.

In this embodiment, as one example of the above-mentioned semiconductor device, a SOP (Small Outline Package) 1 of eight pins is taken and explained.

Explaining a structure of the SOP1, as shown in FIG. 1 and FIG. 2, a semiconductor chip (a first semiconductor chip) 11 that has a surface 11a over which multiple pads 11c, 11d, 11e, and 11f are arranged and a semiconductor chip (a second semiconductor chip) 21 that has a surface 21a over which multiple pads 21c, 21d, 21e, and 21f are arranged are incorporated therein.

Furthermore, as shown in FIG. 2, the semiconductor chip 11 is mounted over an upper surface (a first upper surface) 14a that a thin-plated die pad (a first chip mounting part) 14 has, and on the other hand the semiconductor chip 21 is mounted over an upper surface (a second upper surface) 24a that a thin-plated die pad (a second chip mounting part) 24 has. Furthermore, giving a detailed explanation, a back surface 11b of the semiconductor chip 11 is bonded to the die pad 14 with a medium of a die bonding material 2 (an adhesive) interposed therebetween, and a back surface 21b of the semiconductor chip 21 is bonded to the die pad 24 with a medium of the die bonding material 2 interposed therebetween.

Here, as shown in FIG. 3, the semiconductor chip 11 includes a transmission part (a first transmission part) 12 for transmitting a signal to the outside and a reception part (a first reception part) 13 for receiving a signal from the outside, and on the other hand the semiconductor chip 21 also includes a transmission part (a second transmission part) 22 for transmitting a signal to the outside and a reception part (a second reception part) 23 for receiving a signal from the outside.

Moreover, as shown in FIG. 1, the SOP1 includes multiple inner leads (first leads) 16 that are arranged adjacent to the die pad 14, multiple inner leads (second leads) 26 that are arranged adjacent to the die pad 24, a suspension lead (a first suspension lead) 15 for supporting the die pad 14, and a suspension lead (a second suspension lead) 25 for supporting the die pad 24.

Moreover, the SOP1 includes a wire group (a first wire group) 6 that electrically couples the semiconductor chip 11 and the semiconductor chip 21 and includes multiple wires (first wires) 6a, and a wire group (a second wire group) 7 that electrically couples the semiconductor chip 11 and the semiconductor chip 21 and includes multiple wires (second wires) 7a. Furthermore, the SOP1 includes a wire group (a third wire group) 18 that electrically couples the semiconductor chip 11 and the multiple inner leads 16 and includes multiple wires (third wires) 18a, and a wire group (a fourth wire group) 28 that electrically couples the semiconductor chip 11 and the multiple inner leads 26 and includes multiple wires (fourth wires) 28a.

Furthermore, the SOP1 includes a sealing body 3 that is formed with a resin and seals respective parts of the semiconductor chips 11, 21, the die pads 14, 24, and the suspension leads 15, 25, parts of the multiple first and second leads (the inner leads 16, 26), and the multiple wires 6a, 7a, 18a, and 28a, respectively.

Incidentally, the sealing body 3 has: a first side 3a extending along a first direction 4; a second side 3b extending along a second direction 5 that is substantially perpendicular to the first direction 4; a third side 3c that faces the first side 3a and extends along the first direction 4; and a fourth side 3d that faces the second side 3b and extends along the second direction 5.

Moreover, in plan view, the multiple first leads are arranged along the first side 3a of the sealing body 3, and on the other hand the multiple second leads are arranged along the third side 3c of the sealing body 3. Here, each of the multiple first leads is comprised of the inner lead 16 arranged inside the sealing body 3 and the outer lead 17 that links to the inner lead 16 and is arranged outside the sealing body 3 to serve an external terminal of the SOP1. Incidentally, as shown in FIG. 2, each of the multiple outer leads 17 is bent and formed into a shape of a gull wing and is furnished with exterior plating 8 over each surface.

Similarly, each of the multiple second leads is comprised of the inner lead 26 arranged inside the sealing body 3 and the outer lead 27 that links to the inner lead 26 and is arranged outside the sealing body 3 to serve an external terminal of the SOP1, and each of the multiple outer leads 27 is bent and formed into the shape of a gull wing and is furnished with the exterior plating 8 over each surface.

Here, in the SOP1 of this embodiment, the semiconductor chip 11 and the semiconductor chip 21 are the same semiconductor chip, and as shown in FIG. 1, the semiconductor chip 21 is mounted over the die pad 24 being rotated to a mounting direction of semiconductor chip 11 by 180 degrees.

Moreover, as shown in FIG. 1 to FIG. 3, over the surface 11a of the semiconductor chip 11, the multiple pads 11c electrically coupled with the transmission part 12 and multiple pads 11d electrically coupled with the reception part 13 are arranged.

On the other hand, over the surface 21a of the semiconductor chip 21, the multiple pads 21c electrically coupled with the transmission part 22 and the multiple pads 21d electrically coupled with the reception part 23 are arranged.

Furthermore, the multiple pads 11c of the semiconductor chip 11 and the multiple pads 21d of the semiconductor chip 21 are electrically coupled with one another through the wires 6a of the wire group 6, and on the other hand the multiple pads 11d of the semiconductor chip 11 and the multiple pads 21c of the semiconductor chip 21 are electrically coupled with one another through the wires 7a of the wire group 7.

Moreover, as shown in FIG. 3, the transmission part 12 in the semiconductor chip 11 includes a transmission circuit 12a, a coil (a first coil) 12b electrically coupled with the transmission circuit 12a, and a coil (a second coil) 12c that is arranged over the coil 12b, and is insulated (separated) from the coil 12b, further is, electrically coupled with some pads 11c among the multiple pads 11c.

Moreover, the reception part 13 in the semiconductor chip includes the reception circuit 13a that is coupled with some pads 11d among the multiple pads 11d.

On the other hand, the transmission part 22 in the semiconductor chip 21 includes a transmission circuit 22a, a coil (a fourth coil) 22c electrically coupled with the transmission circuit 22a, and a coil (a third coil) 22b that is arranged over the coil 22c, is electrically insulated (separated) from the coil 22c, and is coupled with some pads 21c among the multiple pads 21c.

Moreover, the reception part 23 in the semiconductor chip 21 includes a reception circuit 23a electrically coupled with some pads 21d among the multiple pads 21d.

Therefore, the SOP1 of this embodiment is a two-channel version semiconductor package that has a pair of coils and over which the transmission part and the reception part (the communication parts) are provided, respectively.

Incidentally, as shown in FIG. 5, some pads 11c coupled with the coils 12c in the semiconductor chip 11 in plan view are arranged so as to be enclosed by the coils 12c on their peripheries. That is, as shown in an enlarged view of FIG. 6, the some pads 11c are arranged inside the spirals of the coils 12c. Moreover, the pad 11c for the GND (or the power supply) is arranged between the two coils 12c. Incidentally, in the two coils 12c, winding directions of the spirals are reverse directions. Moreover, the coils 12c are formed over the surface 11a of the semiconductor chip 11 with a medium of an insulating layer 11m interposed therebetween, and are made of copper (Cu) wiring, for example (the insulating layer 11m is made of polyimide, for example). As shown in FIG. 5, the coils 22b formed in the semiconductor chip 21 have also the same arrangement as that of the coils 12c, and are made of the same copper (Cu) wiring as that of the coils 12c. Furthermore, the coil 12b of the semiconductor chip 11 and the coil 22c of the semiconductor chip 21 shown in FIG. 3 have the same arrangement.

Here, in the SOP1 of this embodiment, as shown in FIG. 3, a system including the transmission part 12 and the reception part 13 of the semiconductor chip 11 is designated as a first power supply system 9, and a system including the transmission part 22 and the reception part 23 of the semiconductor chip 21 is designated as a second power supply system 10.

For example, a power supply voltage of the first power supply system 9 is a low voltage (about several volts), and on the other hand a power supply voltage of the second power supply system 10 is a high voltage (about several hundred volts to several thousand volts).

Therefore, in the SOP1, both in plan view and in the first direction 4 shown in FIG. 1, it is required to secure a withstand voltage between a wire 6a that is closest to the wire group 7 in the wire group 6 and a wire 7a that is closest to the wire group 6 in the wire group 7. Therefore, the inter-wire distance L (L in FIG. 3) between the wire 6a and the wire 7a is made larger than any inter-wire distances in the wire group 6 and in the wire group 7.

Furthermore, taking another expression, in the wire group 6 to which the power supply voltage (low voltage) of the first power supply system 9 is supplied and the wire group 7 to which the power supply voltage (high voltage) of the second power supply system 10 is supplied, the inter-wire distance L (L in FIG. 3) of the wires that are closest to each other is made larger than any inter-wire distances in the wire group 6 and in the wire group 7.

As one example, the inter-wire distance L is 0.4 mm or more.

Thus, in the SOP1 of this embodiment, by making lager the inter-wire distance L between the wire 6a that is closest to the wire group 7 in the wire group 6 and the wire 7a that is closest to the wire group 6 in the wire group 7 than any inter-wire distances in the wire group 6 and in the wire group 7, the withstand voltage can be secured.

That is, since in the semiconductor chip 11 and the semiconductor chip 21, a voltage value differs largely between the first communication part to which the power supply voltage (low voltage) of the first power supply system 9 is supplied and the second communication part to which the power supply voltage (high voltage) of the second power supply system 10 is supplied, by setting (securing) the inter-wire distance between the above-mentioned first communication part and the above-mentioned second communication part wide open, it is possible to secure the withstand voltage. This can prevent electric short circuit between the wire of the above-mentioned first communication part and the wire of the above-mentioned second communication part from occurring, and as a result, improvement of the reliability of the SOP1 can be attained.

Moreover, the reliability can be improved while attaining further miniaturization of the SOP1 compared to a configuration using a photocoupler by having adopted inductor coupling.

Furthermore, since a configuration using the inductor has higher followability to a fast signal than the configuration using the photocoupler, it can support fast signal transmission (transmission of a high-frequency signal).

Here, use application to which the SOP1 of this embodiment can be applied will be explained. The SOP1 of this embodiment is applicable, for example, to automobiles (EV: electric vehicle, HV: hybrid vehicle), motor control systems of electrical household appliances such as a washing machine, a switching regulator, an illumination controller, a solar photovoltaic generation controller, a cellular phone, a mobile communication device, or the like.

As one example of these applications, as shown in a system block diagram using the SOP1 of FIG. 4, the SOP1 can be electrically coupled with loads such as a control circuit 31, a drive circuit 32, and a motor 33. The semiconductor chip 11 has the semiconductor chip 11 controlled by the control circuit 31, performs signal transmission by the inductor coupling between the semiconductor chip 11 and the semiconductor chip 21, further, transmits a signal to the drive circuit 32 through the semiconductor chip 21, and makes the drive circuit 32 drive the motor 33, etc.

For example, as an automobile use, the semiconductor chip 11 is a low voltage chip to which the power supply voltage of the first power supply system 9 is supplied and the power supply voltage at that time is about 5 V, for example; on the other hand, the semiconductor chip 21 is a high voltage chip to which the power supply voltage of the second power supply system 10 is supplied, and the power supply voltage at that time is 600 V to 1000 V or a voltage exceeding those voltages, for example.

In such a case, as one example, by setting the above-mentioned inter-wire distance L in the SOP1 to be L=0.4 mm or more, it becomes possible to secure the withstand voltage also in the automobile use.

Moreover, in the SOP1 of this embodiment, in plan view shown in FIG. 1, the die pad 14 is arranged between the multiple inner leads 16 and the die pad 24, and on the other hand the die pad 24 is arranged between the multiple inner leads 26 and the die pad 14. Furthermore, both in plan view and in the second direction 5 of FIG. 1, a distance (inter-die pad distance) M between the die pad 14 and the die pad 24 is made larger than both a distance N between the die pad 14 and multiple inner leads 16 and a distance P between the die pad 24 and the multiple inner leads 26 (M>N, M>P).

That is, coupling (ground bonding) with a wire is made between the die pad 14 and the semiconductor chip 11 through multiple wires (fifth wires) 19a, and on the other hand the coupling (the ground bonding) with a wire is also made between the die pad 24 and the semiconductor chip 21 through multiple wires (sixth wires) 29a; therefore, potential difference arises also between the both die pads.

Therefore, the withstand voltage is securable by making large a distance M between the die pad 14 and the die pad 24.

For example, in the case where applying the SOP1 to the automobile use, assuming that the low voltage side is about 5 V and the high voltage side is 600 V to 1000 V or a voltage exceeding those voltages, like the above, it becomes possible to secure the withstand voltage like the above by setting the above-mentioned distance M between die pads in the SOP1 to M=0.4 mm or more.

Moreover, in plan view of the SOP1 shown in FIG. 1, the semiconductor chip 11 has on its surface 11a: a side (a first chip side) 11g extending in the first direction 4; a side (a second chip side) 11h facing the side 11g and extending in the first direction 4; a side (a third chip side) 11i intersecting the side 11g and extending in the second direction 5; and a side (a fourth chip side) 11j facing the side 11i and extending in the second direction 5.

Furthermore, in plan view, the side 11g of the semiconductor chip 11 faces the die pad 24, and on the other hand the side 11 h of the semiconductor chip 11 faces a tip of multiple inner leads 16.

In this embodiment, in plan view, the multiple pads 11d are arranged so as to be closer to the side 11g of the semiconductor chip 11 than the multiple pads 11c are. That is, the multiple pads 11d are arranged in positions closer to the side 11g than positions of an imaginary line C1 that is formed by the multiple pads 11c in a line. That is, since the coil 12c is arranged in a region peripheral to the pad 11c, the pad 11d is arranged away from the pad 11c.

Moreover, in plan view, the semiconductor chip 21 has also a side 21g (a first chip side) extending in the first direction 4, a side (a second chip side) 21h facing the side 21g and extending in the first direction 4, a side (a third chip side) 21i intersecting the side 21h and extending in the second direction 5, and a side 21j (a fourth chip side) facing the side 21i and extending in the second direction 5.

Furthermore, in plan view, the side 21g of the semiconductor chip faces the die pad 14, and on the other hand the side 21h of the semiconductor chip 21 h faces tips of the multiple inner leads 26.

That is, since the semiconductor chip 21 is mounted over the die pad 24 being rotated to the mounting direction of the semiconductor chip 11 by 180 degrees, like the semiconductor chip 11, in plan view, the multiple pads 21d are arranged so as to be closer to the side 21g of the semiconductor chip 21 than the multiple pads 21c are. That is, the multiple pads 21d are arranged in positions closer to the side 21g than positions of an imaginary line C2 that is formed by the multiple pads 21c in a line. That is, since the semiconductor chip 21 is the same chip as the semiconductor chip 11 and since the coil 22b is arranged on the periphery of the pad 21c, the pad 21d is arranged away from the pad 21c.

Incidentally, by arranging the pad 11d away from the pad 11c in the semiconductor chip 11 and also arranging the pad 21d away from the pad 21c in the semiconductor chip 21, it is possible to further enlarge the above-mentioned inter-wire distance L, which can further secure the withstand voltage.

Moreover, over the surface 11a of the semiconductor chip 11, the multiple pads (the fifth pads) 11e are arranged along the side 11i, and some pads 11e among the multiple pads 11e are electrically coupled with the upper surface 14a of the die pad 14 through the wires (the fifth wires) 19a of a wire group 19 (a fifth wire group) 19.

Furthermore, in plan view, a long and narrow through hole 14b is provided in a region of the upper surface 14a between the semiconductor chip 11 and a portion where the wire 19a is coupled with the upper surface 14a of the die pad 14.

On the other hand, also in the semiconductor chip 21, the multiple pads (the seventh pads) 21e are arranged along the side 21i over its surface 21a, and some pads 21e among the multiple pads 21e are electrically coupled with the upper surface 24a of the die pad 24 through the wires (the sixth wires) 29a of a wire group (a sixth wire group) 29.

Furthermore, in plan view, a long and narrow through hole 24b is provided in a region of the upper surface 24a between the semiconductor chip 21 and a portion where the wire 29a is coupled with the upper surface 24a of the die pad 24.

Thus, since the through holes 14b, 24b are formed in the die pads 14, 24, it can be prevented that the wires 19a, 29a cannot be coupled thereto due to outflow of the die bond material (the adhesive) 2. That is, even if the die bonding material 2 flows out, the die bonding material 2 can be accumulated in the through holes 14b, 24b, and it is possible to prevent an outflow of the die bonding material 2 to a region where the wires 19a, 29a are coupled.

Incidentally, the through holes 14b, 24b may be concave slots as far as they are in a shape capable of accumulating the die bonding material 2 that flowed out, and also in that case, the same effect can be obtained.

Moreover, since the through holes 14b, 24b are formed in the die pads 14, 24, a resin that forms the sealing body 3 can be filled in the through holes 14b, 24b, which can enhance a resin lock effect (an effect of increasing adhesion of the resin and the die pads) of the resin and the die pads 14, 24. Incidentally, since in the SOP1, areas of the die pads 14, 24 in plan view that occupies an area of the sealing body 3 in plan view are high as compared with areas of the inner leads 16, 26 in plan view, increasing the resin lock effect is effective in enhancing resistance at the time of reflow.

Moreover, the suspension lead 15 of the SOP1 is arranged along the first side 3a of the sealing body 3, the outer leads 17 that are respective parts of the multiple first leads and also a part of the suspension lead 15 are exposed from the first side 3a of the sealing body 3 as external terminals. Incidentally, the suspension leads 15 are leads to which the ground voltage can be supplied from the outside, and the pads 11e to each of which the wire is not coupled among the multiple pads lie are pads to which power supply voltage can be supplied from the outside.

Similarly, regarding the semiconductor chip 21, the suspension lead 25 is arranged along the third side 3c of the sealing body 3, and the outer leads 27 that are parts of the multiple second leads and a part of the suspension lead 25 (the outer lead 27) are exposed from the third side 3c of the sealing body 3 as external terminals. Incidentally, the suspension lead 25 is a lead to which the ground voltage can be supplied from the outside, and the pads 21e to each of which the wire is not coupled among the multiple pads 21e are pads to which power supply voltage can be supplied from the outside.

That is, since the semiconductor chip 21 is the same chip as the semiconductor chip 11, even when the semiconductor chip is mounted being rotated to the semiconductor chip 11 by 180 degrees, it is possible to easily supply the ground voltage and the power supply voltage thereto from the outside.

Moreover, over the surface 11a of the semiconductor chip 11, the multiple pads (the sixth pads) 11f are arranged along the side (the fourth chip side) 11j, some pads 11f of the multiple pads 11f are electrically coupled with some inner leads 16 of the multiple inner leads 16 through some wires 18a in the wire group (the third wire group) 18. Furthermore, leads that are coupled with some pads 11f among the multiple pads 11f are exposed from the first side 3a of the sealing body 3 as the outer leads 17, and are leads to which the power supply voltage can be supplied from the outside. Incidentally, the pads 11f to each of which the wire is not coupled among the multiple pads 11f are pads to which the ground voltage can be supplied from the outside.

Similarly in the semiconductor chip 21, the multiple pads (the eighth pads) 21f are arranged along the side (the fourth chip side) 21j over its surface 21a, and some pads 21f of the multiple pads 21f are electrically coupled with some inner leads 26 of the multiple inner leads 26 through some wires 28a in the wire group (the fourth wire group) 28. Furthermore, leads coupled with the some pads 21f of the multiple pads 21f are exposed from the third side 3c of the sealing body 3 as the outer leads 27, and are leads to which the power supply voltage can be supplied from the outside. Incidentally, the pads 21f to which the wires are not coupled among the multiple pads 21f are pads to which the ground voltage can be supplied from the outside.

That is, regarding the pads 11f, 21f, since the semiconductor chip 11 and the semiconductor chip 21 are the same chip, even when the semiconductor chip 21 is mounted being rotated to the semiconductor chip 11 by 180 degrees, it is possible to easily supply the ground voltage and the power supply voltage thereto from the outside, similarly with what was mentioned above.

Moreover, in the SOP1, since the coils 12c are arranged on the peripheries of the multiple pads 11c over the surface 11a of the semiconductor chip 11, these multiple pads 11c are arranged more inside the semiconductor chip 11 than the multiple pads 11d in plan view. That is, the pads 11c of the transmission part 12 are arranged in positions more inside the semiconductor chip 11 than the pads 11d of the reception part 13.

Moreover, the semiconductor chip 11 and the semiconductor chip 21 are the same chip. Therefore, similarly, since the coils 22b are arranged on the peripheries of the multiple pads 21c over the surface 21a of the semiconductor chip 21, the multiple pads are arranged more inside of the semiconductor chip 21 than the multiple pads 21d in plan view. That is, the pads 21c of the transmission part 22 are arranged in positions more inside the semiconductor chip 21 than the pads 21d of the reception part 23.

Furthermore, as shown in FIG. 7, in the semiconductor chip 11, between the coil (the first coil) 12b and the coil (the second coil) 12c, an insulating layer 11k provided in the chip and the insulating layer 11m further layered over this insulating layer 11k over its surface 11a are arranged, and these layers secure the withstand voltage between the coils. Especially, since the insulating layer 11m over the surface 11a contains a layer comprised of a polyimide system, a larger withstand voltages can be secured.

Incidentally, since the semiconductor chip 11 and the semiconductor chip 21 are the same chip, also in the coil (the fourth coil) 22c and the coil (the third coil) 22b of the semiconductor chip 21, the insulating layer 11k and the insulating layer 11m (an insulating layer 21m shown in FIG. 5) are formed between the both coils like the semiconductor chip 11, and a large withstand voltage is secured.

Moreover, in cross sectional view of the SOP1 shown in FIG. 1 and FIG. 2, it is desirable that a distance Q from wire peaks of the respective wires 6a, 7a of the wire group (the first wire group) 6 and the wire group (the second wire group) 7 to an upper surface 3e of the sealing body 3 be set to be equal to or more than a chip thickness T of the semiconductor chip 11 (semiconductor chip 21) (Q≥T).

Incidentally, although the chip thickness T is 200 μm to 300 μm, for example, when considering a package thickness (the miniaturization) of the SOP1, preferably it should be equal to or less than 200 μm, and it is possible to realize both the miniaturization and securing of the withstand voltage of the SOP1 by setting the above-mentioned distance Q at this time to be equal to or more than 0.2 mm.

That is, since a thickness of a portion of the sealing body 3 that is above the wire peak can be thickened by setting the distance Q from the wire peak to the upper surface 3e of the sealing body 3 to be equal to or thicker than the chip thickness T, it is possible to improve the withstand voltage further and also it is possible to secure the withstand voltage while maintaining the miniaturization of the SOP1 by making small the chip thickness to realize T=Q.

Here, in the SOP1 of this embodiment, a reason why the inter-wire distance L shown in FIG. 1 and the inter-die pad distance M were set to be equal to or more than 0.4 mm, respectively, as one example, and the distance Q from the wire peak to the sealing body upper surface was set to be equal to or more than 0.2 mm will be explained in detail using FIG. 8.

First, a reason why the inter-wire distance L and the inter-die pad distance are set to be equal to or more than 0.4 mm, respectively, will be explained. FIG. 8 shows a relationship between the withstand voltage of the sealing resin and the distance (being measured in conformity to ASTM-D149).

As one example, a case where a target withstand voltage is set to be equal to or more than 3.5 kV will be explained. Regarding the withstand voltage between the resin, in order to secure the target withstand voltage, the distance should be larger than about 0.2 mm, as is clear from FIG. 8. However, if the distance is too large, it will interfere with the miniaturization of the semiconductor device (the SOP1). Therefore, the safety factor was expected to be about 2 times (Min 6.8 kV), and the inter-wire distance L and inter-die pad distance M were set to be equal to or more than 0.4 mm, respectively.

Next, explaining a reason why the distance Q from the wire peak to the sealing body upper surface (resin thickness) was set to be equal to or more than 0.2 mm, it comes from a thought that a resin thickness of 0.2 mm gives a withstand voltage of 3.4 kV at minimum, and a withstand voltage of an air layer is added to this, so that the target withstand voltage equal to or more than 3.5 kV is secured.

For example, assume that a metallic chassis of a product enclosure, etc. is arranged at a point 1-mm above the sealing body 3 of the semiconductor device (the SOP1) of this embodiment. Since a withstand voltage of dry air is about 3.0 kV/mm, a withstand voltage between the wire and the metallic chassis becomes: 3.4 kV (a resin withstand voltage)+3.0 kV/mm (the withstand voltage of air)×1 mm (a distance between the metallic chassis and the sealing body 3)=6.4 kV. This calculated value corresponds to the target withstand voltage 3.5 kV or more, exceeding 3.5 kV considerably, and therefore, the distance Q from the wire peak to the sealing body upper surface (resin thickness) is set to be equal to or more than 0.2 mm.

Next, a method for assembling the semiconductor device (the SOP1) of this embodiment will be explained along a manufacture flowchart shown in FIG. 9 to FIG. 11.

Figure 10:
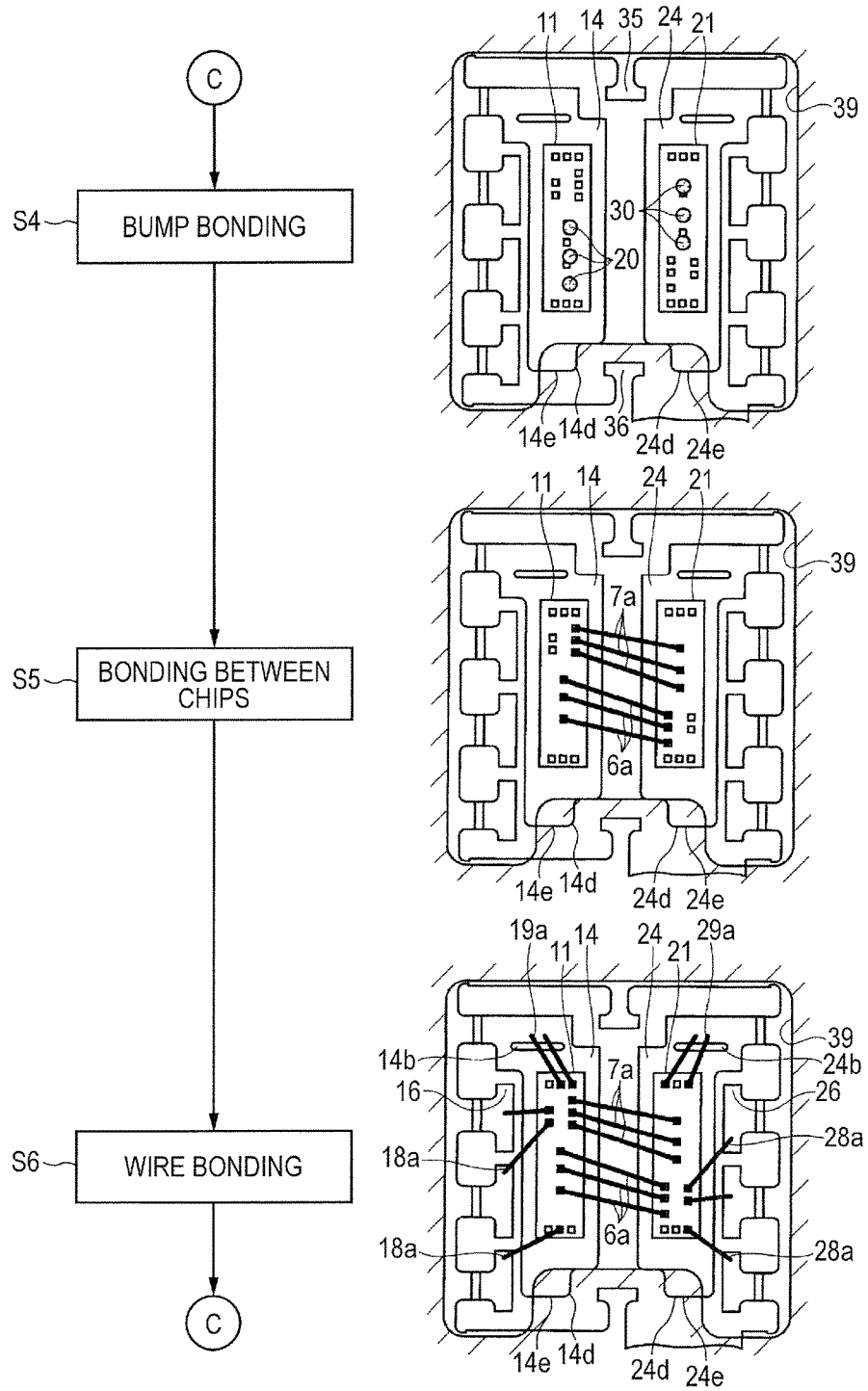
FIG. 10 is a flowchart and a plan view showing the one example of the principal process in the assembly of the semiconductor device of FIG. 1.
Figure 11:
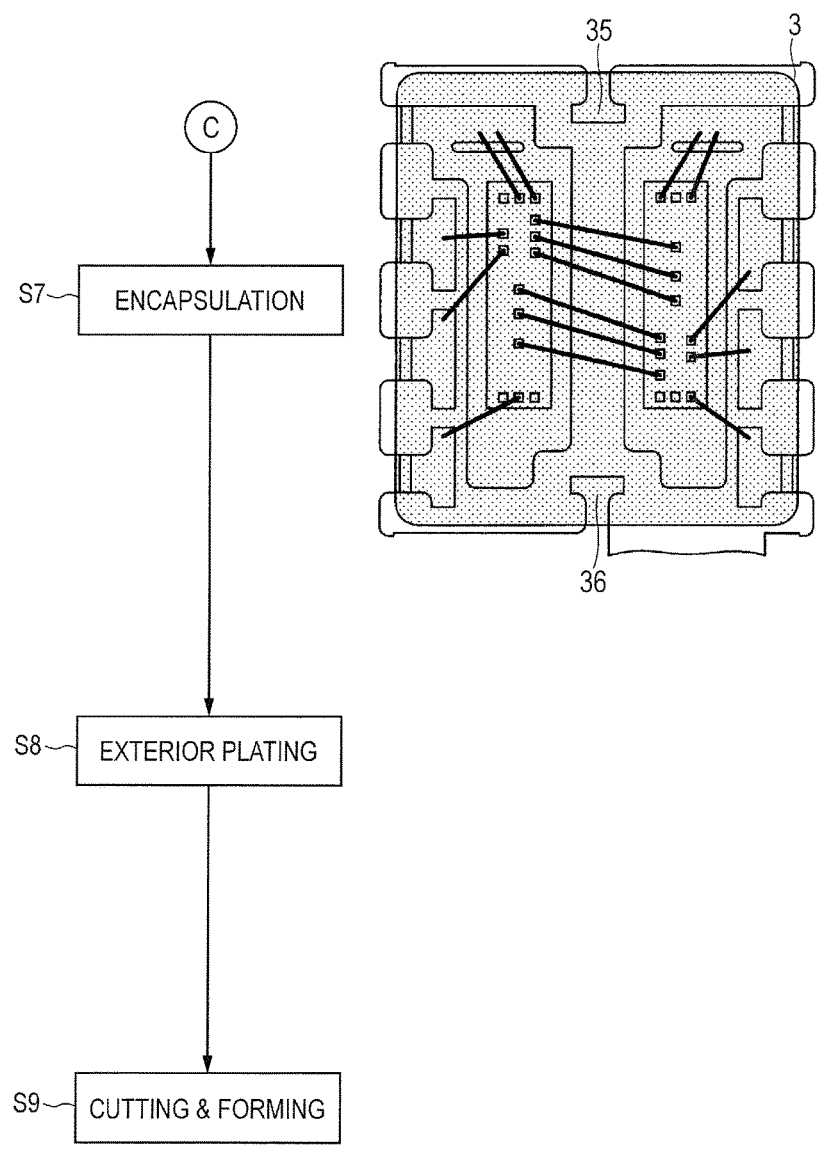
FIG. 11 is a flowchart and a plan view showing the one example of the principal process in the assembly of the semiconductor device of FIG. 1.
Figure 12:
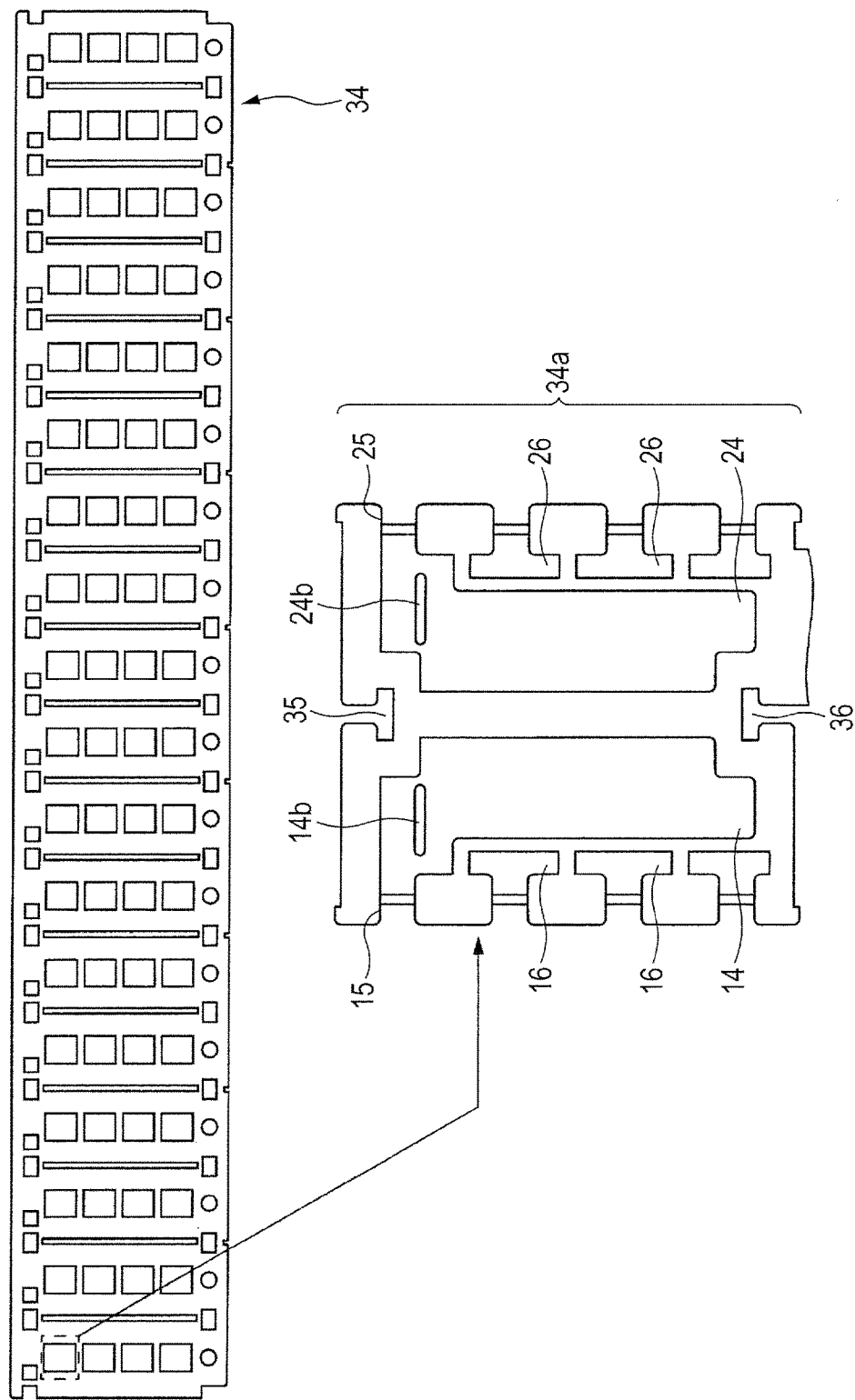
FIG. 12 are a plan view and an enlarged local plan view showing one example of a structure of a lead frame used in the assembly of the semiconductor device of FIG. 1.
Figure 13:
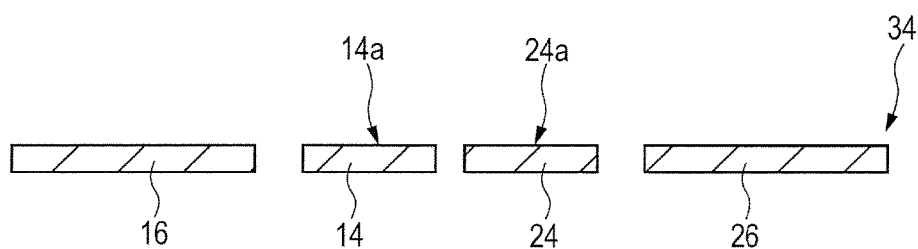
FIG. 13 is a sectional view showing one example of the structure of a device region of the lead frame shown in FIG. 12.
Figure 14:
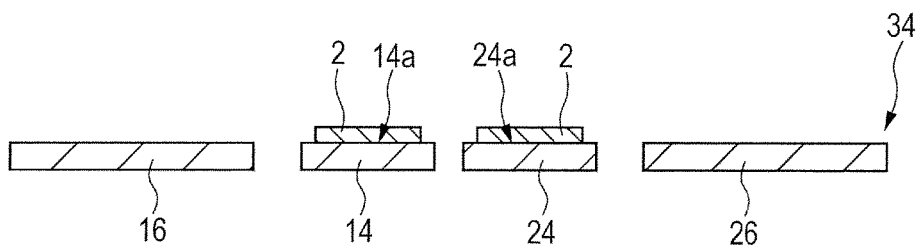
FIG. 14 is a sectional view showing one example of a structure after paste coating of the assembly of the semiconductor device of FIG. 1.
Figure 15:
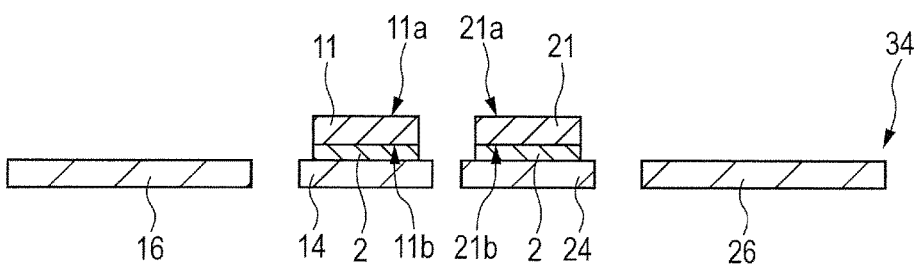
FIG. 15 is a sectional view showing one example of a structure after die bonding of the assembly of the semiconductor device of FIG. 1.
Figure 16:
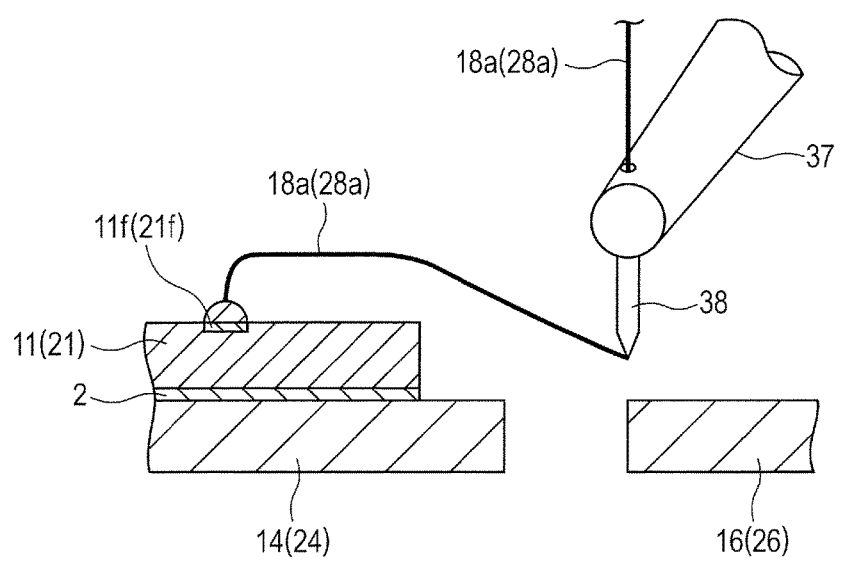
FIG. 16 is a conceptual diagram showing one example of tools used in wire bonding of the assembly of the semiconductor device of FIG. 1.
Figure 17:
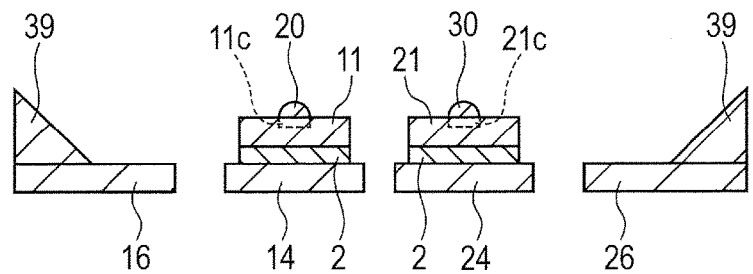
FIG. 17 is a sectional view showing one example of a structure after bump bonding of the assembly of the semiconductor device of FIG. 1.
Figure 18:
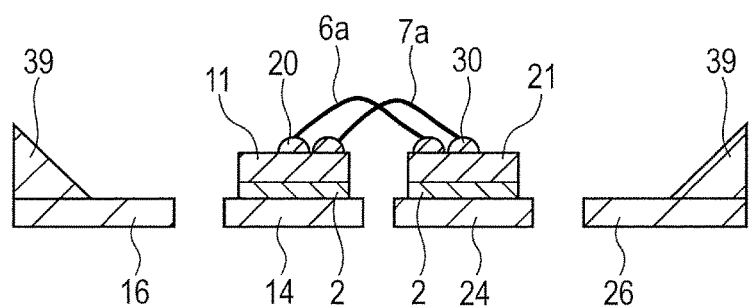
FIG. 18 is a sectional view showing one example of structure after bonding between chips of the assembly of the semiconductor device of FIG. 1.
Figure 19:
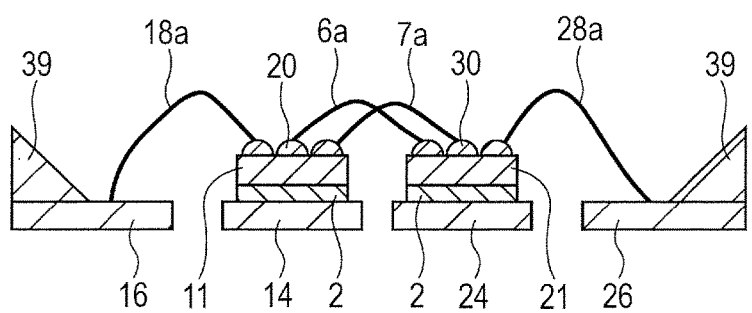
FIG. 19 is a sectional view showing one example of a structure after the wire bonding of the assembly of the semiconductor device of FIG. 1.

FIG. 9 is a flowchart and a plan view showing one example of a principal process in an assembly of the semiconductor device, FIG. 10 is a flowchart and a plan view showing one example of the principal process in the assembly of the semiconductor device of FIG. 1, FIG. 11 is a flowchart and a plan view showing one example of the principal process in the assembly of the semiconductor device of FIG. 1, and FIG. 12 is a plan view and enlarged local plan view showing one example of a structure of a lead frame used in the assembly of the semiconductor device of FIG. 1. Moreover, FIG. 13 is a sectional view showing one example of a structure of a device region of the lead frame shown in FIG. 12, FIG. 14 is a sectional view showing one example of a structure after paste coating of the assembly of the semiconductor device of FIG. 1, FIG. 15 is a sectional view showing one example of a structure after die bonding of the assembly of the semiconductor device of FIG. 1, and FIG. 16 is a conceptual diagram showing one example of tools used in wire bonding of the assembly of the semiconductor device of FIG. 1. Furthermore, FIG. 17 is a sectional view showing one example of a structure after bump bonding of the assembly of the semiconductor device of FIG. 1, FIG. 18 is a sectional view showing one example of a structure after inter-chip bonding of the assembly of the semiconductor device of FIG. 1, FIG. 19 is a sectional view showing one example of a structure after the wire bonding of the assembly of the semiconductor device of FIG. 1, and FIG. 20 is a local sectional view showing one example of a structure after clamping with a mold in an encapsulation process of the assembly of the semiconductor device of FIG. 1.

Figure 20:
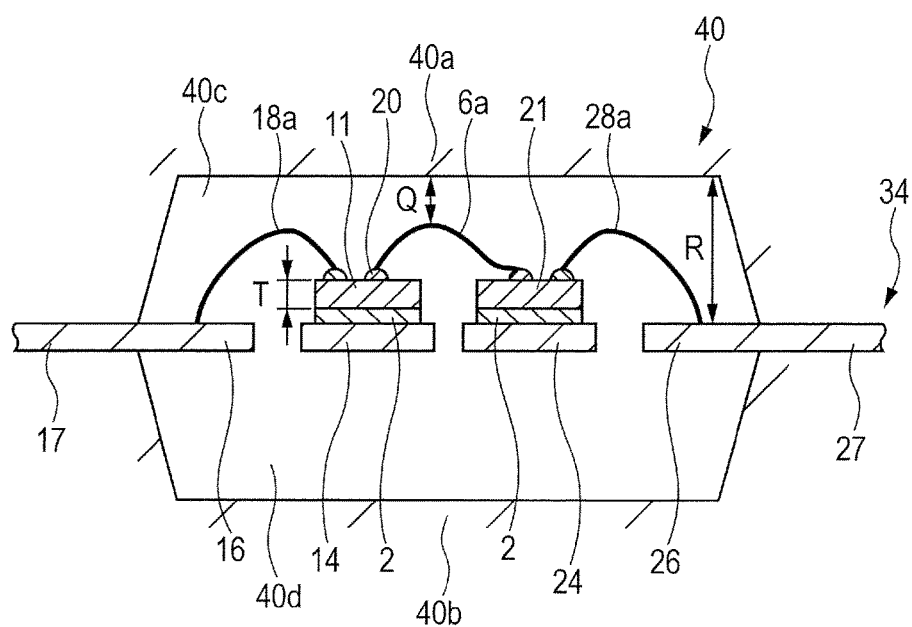
FIG. 20 is a local sectional view showing one example of a structure after clamping with a mold in an encapsulation process of the assembly of the semiconductor device of FIG. 1.
Figure 21:
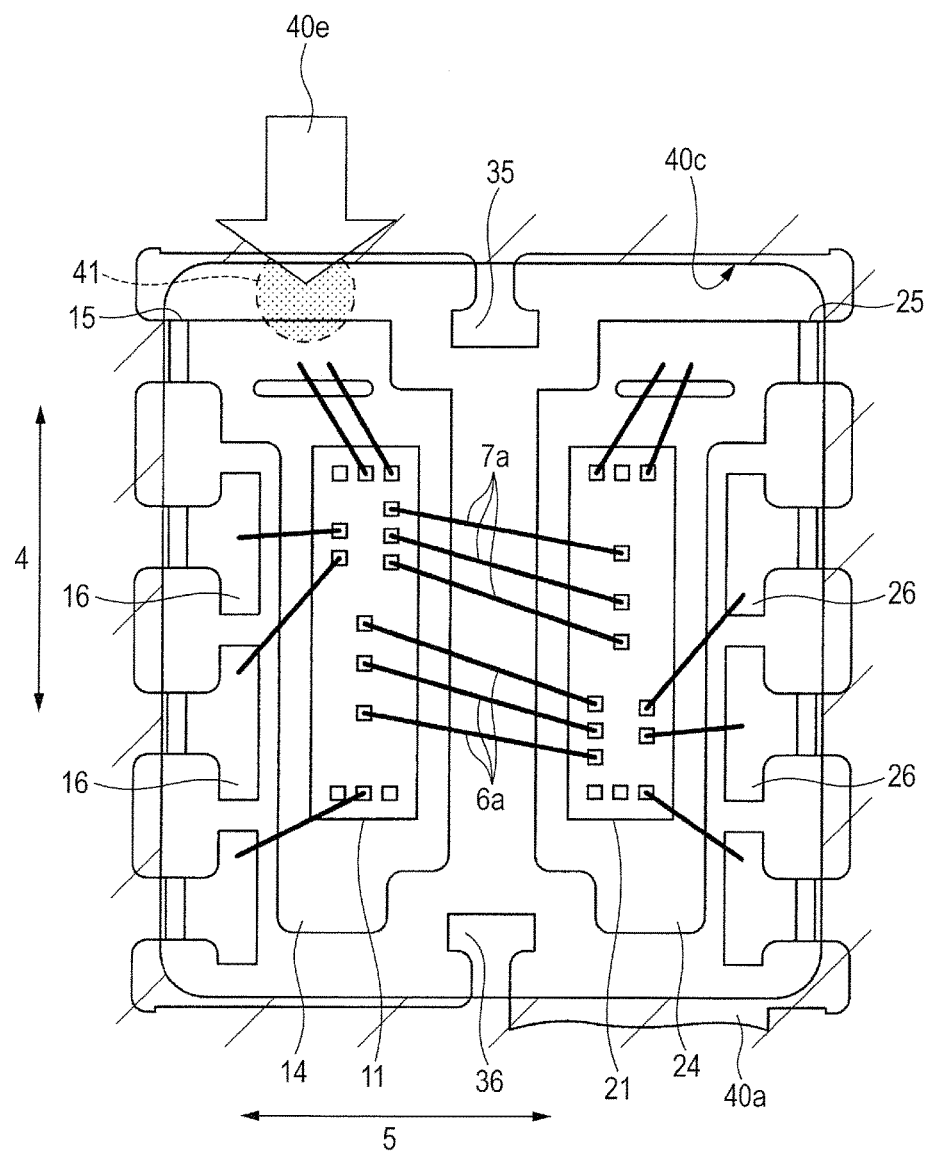
FIG. 21 is a local plan view showing one example of a resin injection direction after clamping with the mold in FIG. 20.
Figure 22:
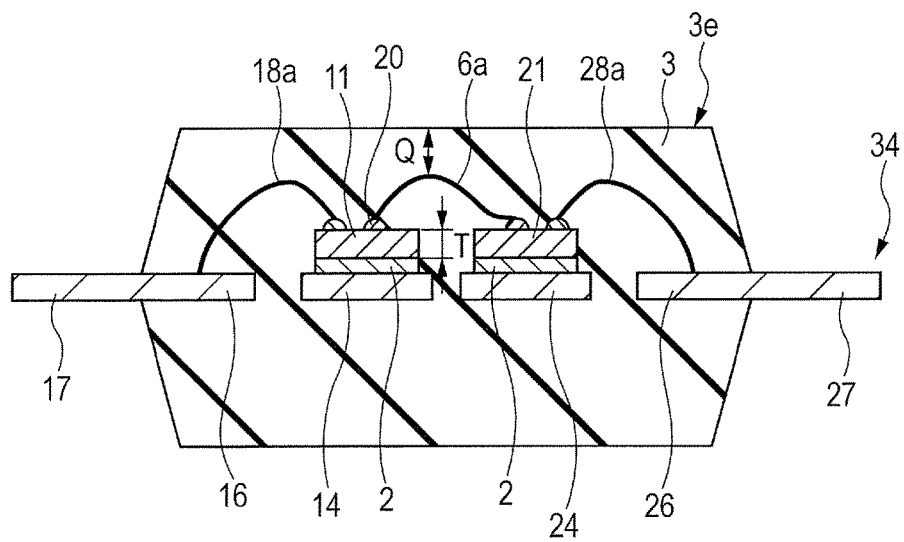
FIG. 22 is a sectional view showing one example of a structure after encapsulation of the assembly of the semiconductor device of FIG. 1.
Figure 23:
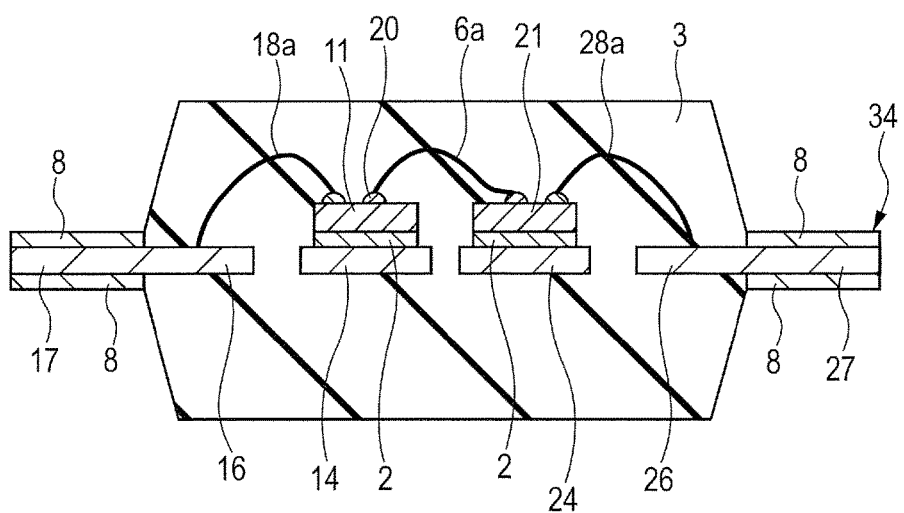
FIG. 23 is a sectional view showing one example of a structure after exterior plating formation of the assembly of the semiconductor device of FIG. 1.
Figure 24:
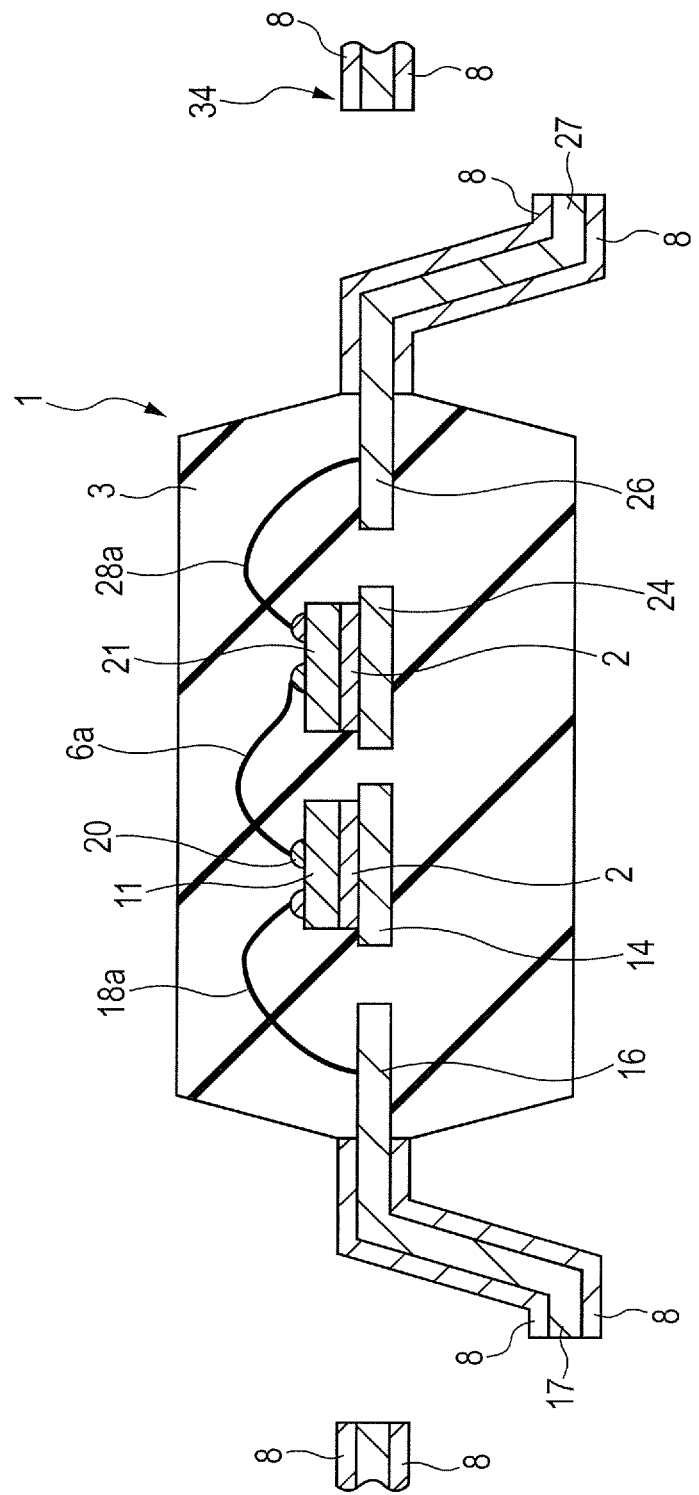
FIG. 24 is a local sectional view showing one example of a structure after cutting and forming of the assembly of the semiconductor device of FIG. 1.

Moreover, FIG. 21 is a local plan view showing one example of a resin injection direction after clamping with the mold in FIG. 20, FIG. 22 is a sectional view showing one example of a structure after encapsulation of the assembly of the semiconductor device of FIG. 1, FIG. 23 is a sectional view showing one example of a structure after exterior plating formation of the assembly of the semiconductor device of FIG. 1, and FIG. 24 is a local sectional view showing one example of a structure after cutting and forming of the assembly of the semiconductor device of FIG. 1.

First, the lead frame shown in Step S1 of FIG. 9 is prepared. Here, as shown in FIG. 12 and FIG. 13, a lead frame 34 is prepared that has the die pad 14 supported by the suspension lead 15, the die pad 24 supported by the suspension lead 25, the multiple inner leads 16 arranged adjacent to the die pad 14, and the multiple inner leads 26 arranged adjacent to the die pad 24.

Incidentally, many device regions 34a in each of which a single package is formed are formed in a matrix array in the lead frame 34, which is a so-called multiple metallic lead frame (for example, made of a copper alloy, a steel-nickel alloy, etc.) in a thin plate shape.

After this, Ag paste application shown in Step S2 of FIG. 9 is performed. Here, as shown in FIG. 14, Ag paste is applied over each of the die pad 14 and the die pad 24 as the die bonding material (the adhesive) 2.

Furthermore, the die bonding shown in Step S3 of FIG. 9 is performed. Here, as shown in FIG. 15, the semiconductor chip 11 is mounted over the die pad 14 through the die bonding material 2, and on the other hand the semiconductor chip 21 is mounted over the die pad 24 through the die bonding material 2. Incidentally, the semiconductor chip 11 and the semiconductor chip 21 are the same semiconductor chip, and in a die bonding process, the semiconductor chip 21 is mounted over the die pad after being rotated to the mounting direction of the semiconductor chip 11 by 180 degrees as shown in plan view of Step S3 of FIG. 9.

Moreover, the long and narrow through holes 14b, 24b are formed on sides of respective one ends of the die pad 14 and the die pad 24. Since the through holes 14b, 24b are formed in the die pads 14, 24, even when flowing out (bleeding) of the die bonding material occurs, the die bonding material 2 that flowed out can be accumulated in the through holes 14b, 24b.

That is, even if the die bonding material 2 flows out, the die bonding material 2 can be accumulated in the through holes 14b, 24b, and it is possible to prevent the outflow of the die bonding material 2 to a region where down bonding is performed.

This can prevent the outflow of the die bonding material from making it impossible for the wires 19a, 29a to be coupled. That is, even if the die bonding material 2 flows out, the die bonding material 2 can be accumulated in the through holes 14b, 24b, and it is possible to prevent the outflow of the die bonding material 2 to a region where the down bonding is performed.

Incidentally, what is to be required for the through holes 14b, 24b is just to be in a shape that can stop the die bonding material 2 that flowed out, for example, they may be in a shape of a concave slot, etc., and also in that case, the same effect can be obtained.

After that, the wire bonding is performed. Regarding the wire bonding of this embodiment, a case of adopting an ultrasonic wire bonding system that applies an ultrasonic wave to each of multiple wires through bonding tools such as an ultrasonic horn 37 and a capillary 38 at the time of the wire bonding, as shown in FIG. 16, will be explained. That is, while a wire is drawn out by the capillary 38 provided near a tip of the ultrasonic horn 37, the wire bonding is performed with an ultrasonic wave applied to the wire by the ultrasonic horn 37 and the capillary 38.

Moreover, in the wire bonding of this embodiment, the wire bonding is performed with respective second ends 14d, 24d of the die pad 14 and the die pad 24 pressed down by a clamper 39.

This is because, as shown in FIG. 1, the die pads 14, 24 have first ends 14c, 24c and the second ends 14d, 24d that face the first ends 14c, 24c in the first direction 4, respectively, further, the suspension leads 15, 25 are coupled to the first ends 14c, 24c of the die pads 14, 24, respectively, and the second ends 14d, 24d are configured to be open ends 14e, 24e, respectively.

That is, since the sides of the second ends 14d, 24d of the die pads 14, 24 are not supported by the suspension leads, the die pads are easy to flap at the time of the wire bonding. Therefore, at the time of the wire bonding as shown in FIG. 10, by pressing the second ends 14d, 24d on the side that are not supported by suspension leads of the die pads 14, 24 with the clamper 39, it is possible to suppress flapping of the respective leads, and as a result, to reduce wire bonding defect caused by flapping of the die pads 14, 24.

Incidentally, respective open ends 14e, 24e of the second end 14d of the die pad 14 and the second end 24d of the die pad 24 are in a free state where they are not coupled with anything at all including suspension leads. Moreover, a reason why the second ends 14d, 24d of the die pads 14, 24 are in a free state where they are not coupled with anything at all is to secure the withstand voltage.

That is, a letter T lead 36 is arranged in the vicinity of the second ends 14d, 24d of the die pads 14, 24. If suspension leads are coupled, the withstand voltage cannot be secured between them and the letter T lead 36. Therefore, the second ends 14d, 24d are configured to be open ends (single suspension) 14e, 24e, respectively, without being coupled with suspension leads etc.

Thereby, in the wire bonding of this embodiment, the wire bonding is performed while the second ends 14d, 24d on the sides that are not supported by the suspension leads of the die pads 14, 24 are pressed down by the clamper 39.

In the wire bonding process, first, the bump bonding shown in Step S4 of FIG. 10 is performed. Incidentally, as shown in FIG. 1 and FIG. 9, over the surface 11a of the semiconductor chip 11, the multiple pads 11c electrically coupled with the transmission part 12 of FIG. 3 and the multiple pads 11d electrically coupled with the reception part 13 are arranged. On the other hand, over the surface 21a of the semiconductor chip 21, the multiple pads 21c electrically coupled with the transmission part 22 of FIG. 3 and the multiple pads 21d electrically coupled with the reception part 23 are arranged.

First, as shown in FIG. 10 and FIG. 17, a first stud bump 20 is formed over one pad 11c among the multiple pads 11c of the semiconductor chip 11. On the other hand a second stud bump 30 is formed over one pad 21c among the multiple pads 21c of the semiconductor chip 21.

After that, bonding between chips shown in Step S5 of FIG. 10 is performed. That is, as shown in FIG. 1, some (pads 11c, 11d) of the multiple pads of the semiconductor chip 11 and some (pads 21c, 21d) of the multiple pads of the semiconductor chip 21 are electrically coupled with one another with the multiple wires 6a, 7a, respectively. In the bonding between chips, first, one end of the wire 6a is coupled onto one pad 21d among the multiple pads 21d of the semiconductor 21 of FIG. 1, and subsequently the other end of the wire 6a is couple onto the first stud bump 20.

Similarly, one end of the wire 7a is coupled onto one pad 11d among the multiple pads 11d of the semiconductor 11, subsequently the other end of the wire 7a is couple onto the second stud bump 30, and the bonding between chips is completed as shown in FIG. 18.

That is, in the bonding between chips of this embodiment, since if second bonding is performed to the pad over the chip, the chip is damaged by the capillary 38, the bonding cannot be directly performed to the pad in a place of the second bonding. Therefore, after the stud bump is formed in advance over the pad on the second side by stud bonding (the bump bonding), the bonding on the second side is performed there. That is, this process is one that secures a height at which the second bonding is intended to be performed by having forming the stud bump on a second bonding side, whereby the semiconductor chip can be prevented from being damaged.

In this embodiment, at this occasion, what is adopted for the second side is a pad whose insulating layer under the pad is thicker, and the second bonding is performed to it. That is, since two times of the wire bonding are performed on the second side, i.e., the bump bonding and the second bonding, it is desirable that a pad having a thick insulating layer under the pad be selected as the second side. Therefore, in this embodiment, the pads 11c, 21c formed on the insulating layers 11m, 21m shown in FIG. 5 and FIG. 7 are selected as the second side.

That is, the insulating layers 11m, 21m are configured to be arranged both under the pad over which the first stud bump 20 is formed among the multiple pads 11c of the semiconductor chip 11 and under the pad over which the second stud bump 30 is formed among the multiple pads 21c of the semiconductor chip 21. Incidentally, the insulating layers 11m, 21m each contain a layer comprised of a polyimide.

This can mitigate a damage imposed on a circuit layer that is formed under the pad 11c and the pad 21c.

Incidentally, in the bonding between chips after stud bump formation, as shown in FIG. 1, the multiple pads 11c of the semiconductor chip 11 and the multiple pads 21d of the semiconductor chip 21 are coupled with one another with multiple wires 6a included in the wire group 6, respectively. Furthermore, the multiple pads 11d of the semiconductor chip 11 and the multiple pads 21c of the semiconductor chip 21 are coupled with one another with the multiple wires 7a included in the wire group 7, respectively. At that time, the wire bonding is performed so that the inter-wire distance L between the wire 6a that is closest to the wire group 7 in the wire group 6 and the wire 7a that is closest to the wire group 6 in the wire group 7 may become larger than any inter-wire distances in the wire group 6 and in the wire group 7.

As one example, the inter-wire distance L is 0.4 mm or more.

Thus, in the assembly of the SOP1 of this embodiment, by making the inter-wire distance L between the wire 6a that is closest to the wire group 7 in the wire group 6 and the wire 7a that is closest to the wire group 6 in the wire group 7 larger than any inter-wire distances in the wire group 6 and in the wire group 7, it is possible to secure the withstand voltage of the SOP1.

As a result, the improvement of the reliability of the SOP1 can be attained.

That is, in the semiconductor chip 11 and the semiconductor chip 21, in the case where voltage values differ largely between the first communication part to which the power supply voltage (low voltage) of the first power supply system 9 of FIG. 3 is supplied and the second communication part to which the power supply voltage (high voltage) of the second power supply system 10 is supplied, it is possible to secure the withstand voltage by making the inter-wire distance in the above-mentioned first communication part and the above-mentioned second communication part wide open. This can prevent the electric short circuit between the wire of the above-mentioned first communication part and the wire of the above-mentioned second communication part from occurring, and as a result, the improvement of the reliability of the SOP1 can be attained.

Furthermore, reliability can be improved while the miniaturization of the SOP1 is attained because of adoption of the inductor (coil) coupling.

After that, the wire bonding shown in Step S6 of FIG. 10 is performed. Here, first, as shown in FIG. 19, the wire bonding between the chip and the lead is performed. That is, as shown in FIG. 1 and FIG. 19, some (the pad 11f) of the multiple pads of the semiconductor chip 11 and the multiple inner leads 16 are electrically coupled with one another with multiple wires 18a, respectively. Moreover, some (pad 21f) of the multiple pads of the semiconductor chip 21 and the multiple inner leads 26 are electrically coupled with one another with the multiple wires 28a, respectively.

Furthermore, some (the pad 11e) of the multiple pads of the semiconductor chip 11 and the suspension lead 15 (the die pad 14) are electrically coupled with the wire 19a, and some (the pad 21e) of the multiple pads of the semiconductor chip and the suspension lead 25 (the die pad 24) are electrically coupled with the wire 29a.

That is, the ground bonding is performed to the die pads 14, 24 from the semiconductor chip 11 and the semiconductor chip 21, respectively. In doing this, since in the die pads 14, 24, their second ends 14d, 24d are pressed down by the clamper 39, there is no space where the ground bonding is performed. Therefore, the ground bonding is performed so as to make coupling to the sides of the first ends 14c, 24c (sides that are not pressed down by the clamper 39) that are opposite sides to the second ends 14d, 24d. Thereby, the ground bonding can be performed with the die pads 14, 24 firmly pressed down on the sides of the second ends 14d, 24d of the open ends 14e, 24e.

Furthermore, when performing the ground bonding on the sides of the first ends 14c, 24c of the die pads 14, 24, the wire bonding is performed so that the wire may jump over the through holes 14b, 24b provided in the die pads 14, 24. Since the sides of the first ends 14c, 24c of the die pads 14, 24 have comparatively large areas, exfoliation takes place easily between the die pads 14, 24 and the resin. Then, since the through holes 14b, 24b are formed in the areas of the die pads 14, 24 with large areas, adhesion of the die pads 14, 24 and the resin in this areas can be improved, so that exfoliation between the die pads 14, 24 and the resin at the time of reflow can be reduced.

Furthermore, since the exfoliation between the die pads 14, 24 and the resin can be reduced, wire cutting in this vicinity can be reduced.

The wire bonding process is ended by the above.

The encapsulation (sealing) shown in Step S7 of FIG. 11 is performed after completion of the wire bonding. Here, the semiconductor chips 11, 21, respective parts of the suspension leads 15, 25, the die pads 14, 24, some of the multiple first and second leads (the inner leads 16, 26), and the multiple wires 6a, 7a, 18a, 28a, 19a, and 29a are sealed by sealing resin 41 (insulating resin) shown in FIG. 21. That is, using the sealing resin 41, the sealing body 3 is formed that has the first side 3a and the third side 3c that extend in the first direction 4 shown in FIG. 1 and the second side 3b and the fourth side 3d that extend in the second direction 5 substantially perpendicular to the first direction 4.

Therefore, in the encapsulation process of this embodiment, the sealing resin 41 of FIG. 21 is poured toward the fourth side 3d from the second side 3b of the sealing body 3 shown in FIG. 1 to form the sealing body 3. This is done because, as shown in FIG. 1, the suspension leads 15, 25 are provided so as to be closer to the second side 3b than the fourth side 3d of the sealing body 3 are in plan view, and as shown in FIG. 21, by arranging a gate 40e for molding on the suspension lead side and injecting the sealing resin 41 from the suspension lead side, it is possible to suppress the flapping of the die pads 14, 24 at the time of resin injection.

Moreover, in the case where a through gate system is adopted, the sealing resin 41 comes out from a side opposite to the gate 40e, and flows into the next cavity.

Here, a resin forming mold 40 of FIG. 20 used in this embodiment includes a pair of an upper mold (a first mold) 40a and a lower mold (a second mold) 40b; a cavity (a first cavity) 40c is formed in the upper mold 40a, and on the other hand a cavity (a second cavity) 40d is formed in the lower mold 40b.

Furthermore, in the resin forming mold 40, a depth R of the cavity 40c of the upper mold 40a is a depth capable of forming a relationship so that the distance Q from the wire peak of the wire 6a (the wire 7a) of the wire group 6 (the wire group 7) to the upper surface 3e of the sealing body 3 may become equal to or more than the chip thickness T of the semiconductor chip 11 (Q≥T).

In the encapsulation process, first, the resin forming mold 40 that includes the upper mold 40a having the cavity 40c as shown in FIG. 20 and a lower mold 40b making a pair with the upper mold 40a and facing the upper mold 40a is prepared.

After that, the lead frame 34 is positioned so that the semiconductor chips 11, 21 may be located within the cavity 40c of the upper mold 40a. Furthermore, after holding the lead frame 34 with the upper mold 40a and the lower mold 40b, the sealing resin 41 is poured into the cavity 40c from the gate 40e linking to the cavity 40c.

That is, as shown in FIG. 21, the sealing resin 41 is injected (supplied) into the cavity 40c from the gate 40e that is arranged on the suspension lead side.

Thereby, it can suppress the flapping of the die pads 14, 24.

Moreover, since the depth R of the cavity 40c of the upper mold 40a is made to be a depth capable of forming a relationship so that the distance Q from the wire peak to the sealing body upper surface may become equal to or more than the chip thickness T of the semiconductor chip 11 (Q≥T) in FIG. 22, the sealing body 3 can be formed so that the distance Q from the wire peak to the sealing body upper surface may become equal to or more than the chip thickness T of the semiconductor chip 11 (Q≥T).

Moreover, because of the through holes 14b, 24b being formed in the die pads 14, 24, the sealing resin 41 can be embedded into each of the through holes 14b, 24b at the time of the resin injection, and the resin lock effect of the resin 41 for sealing (the sealing body 3) and the die pads 14, 24 can be enhanced. Incidentally, in the SOP1, since the areas of the die pads 14, 24 in plan view are large as compared with the area of the sealing body 3 in plan view, it is very effective to enhance the resin lock effect.

After completion of the encapsulation, exterior plating shown in Step S8 of FIG. 11 is performed. That is, as shown in FIG. 23, the exterior plating 8 comprised of solder, etc. is performed over respective surfaces of the multiple outer leads 17, 27 exposed from side faces of the sealing body 3.

After that, cutting and forming shown in Step S9 of FIG. 11 are performed. That is, the outer leads 17, 27 that link to respective leads 15, 25 shown in FIG. 1 and the outer leads 17, 27 that link to respective multiple leads 16, 26 shown in FIG. 24 are cut off from the lead frame 34, and each of the multiple outer leads 17, 27 is formed and bent into the shape of a gull wing.

Incidentally, as shown in FIG. 21, in places corresponding to respective central parts and their vicinities of the second side 3b and the fourth side 3d of the sealing body 3 of FIG. 1, the letter T leads 35, 36 are provided being linking to the lead frame 34, and at a stage where the sealing body 3 is formed, the letter T leads 35, 36 are in a state where their tips are embedded in the inside of the sealing body 3.

Thus, by the tips of the letter T leads 35, 36 being embedded in the inside of the sealing body 3 with the letter T leads 35, 36 linked to the lead frame 34, it is possible to prevent the package body from dropping out from the lead frame 34 when the respective outer leads 17, 27 are cut off from the lead frame 34 by lead cutting after completion of the encapsulation.

That is, even when the respective outer leads 17, 27 are cut off, the package body (the SOP body) is in a state of being supported by the lead frame 34 with the letter T leads 35, 36, and does not come off from the lead frame 34.

Moreover, since even when the letter T leads are cut off from the lead frame finally and the package body is cut off from the lead frame 34 completely, letter T portion are in a state of being embedded in the sealing body 3, the letter T leads 35, 36 do not drop out, and dropping-out of the letter T leads 35, 36 from the sealing body 3 can be prevented.

By the above, the assembly of the SOP1 has completed.

Next, a modification of this embodiment will be explained.

Figure 25:
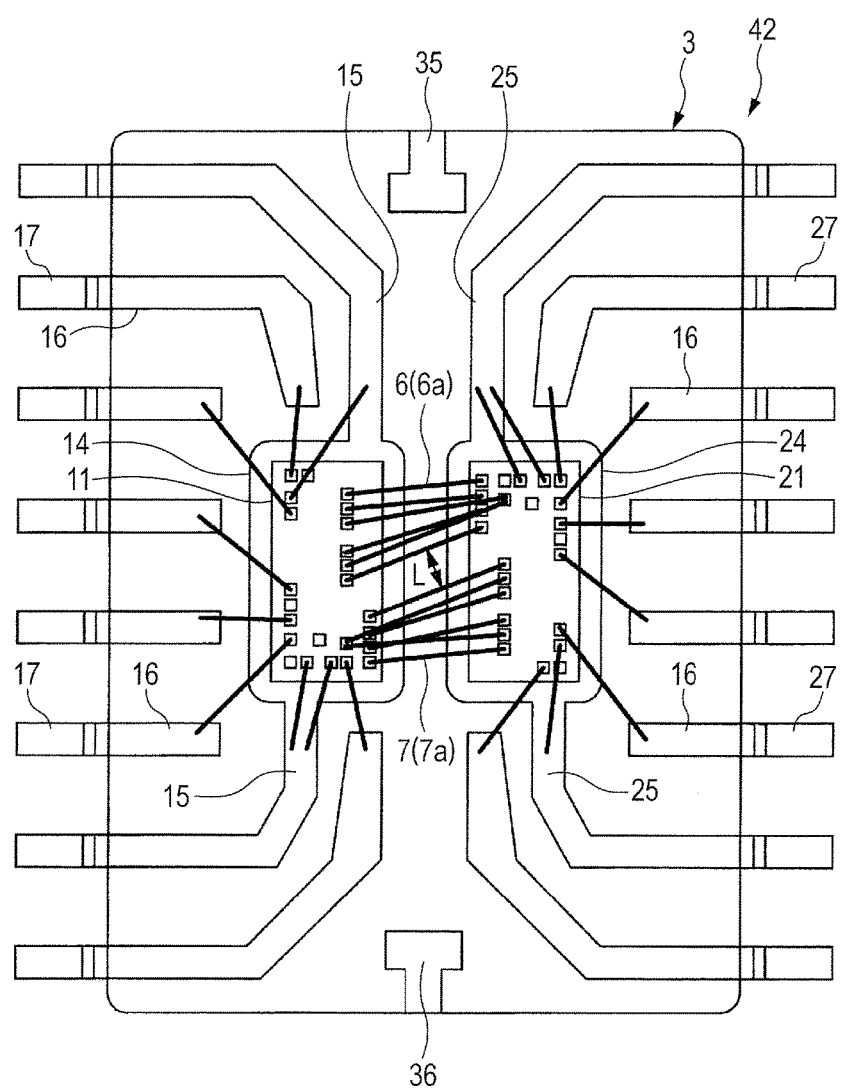
FIG. 25 is a plan view showing a structure of the semiconductor device of a modification of the embodiment with the sealing body penetrated.

FIG. 25 is a plan view showing a structure of a semiconductor device of a modification of the embodiment with the sealing body penetrated.

FIG. 25 shows a 16-pin SOP42 of a four-channel version as a modification of the above-mentioned semiconductor device. That is, even if the number of channels increases to four channels, it is possible to secure the withstand voltage, like the SOP1 of the above-mentioned embodiment, by making larger the inter-wire distance L between the wire 6a that is closest to the wire group 7 in the wire group 6 that performs coupling between the transmission part and the reception part (communication parts) and the wire 7a that is closest to the wire group 6 in the wire group 7 than any inter-wire distances in the wire group 6 and in the wire group 7.

Thereby, improvement of the reliability can be attained also in the 16-pin SOP42 of the four-channel version.

In the foregoing, although the invention made by the present inventors was concretely explained based on the embodiments of the invention, it goes without saying that the present invention is not limited to the embodiments of the invention, and can be modified variously within a range that does not deviate from its gist.

For example, although in the above-mentioned embodiments, the case where the semiconductor chip 11 and the semiconductor chip 21 were the same chip was taken and explained, the semiconductor chip 11 and the semiconductor chip 21 are not necessarily required to be the same chip.

That is, in the case where the semiconductor device is a semiconductor device such that the semiconductor chips have communication functions, respectively, and perform communication therebetween through wires and also by the inductor coupling, and the voltage values are different between the communication parts, the multiple semiconductor chips that are mounted thereon are not required to be the same chip.

Moreover, the following embodiments may also be included.

(Additional Remark)

[Clause 1] A method for manufacturing a semiconductor device that includes the steps of: a) preparing a lead frame that has a first chip mounting part supported by a first suspension lead, a second chip mounting part supported by a second suspension lead, multiple first leads arranged adjacent to the first chip mounting part, and multiple second leads arranged adjacent to the second chip mounting part; b) mounting a first semiconductor chip over the first chip mounting part and mounting a second semiconductor chip over the second chip mounting part; c) electrically coupling some of multiple pads of the first semiconductor chip and some of multiple pads of the second semiconductor chip with multiple wires, respectively; d) electrically coupling some of the multiple pads of the first semiconductor chip and the multiple first leads with multiple wires, respectively; e) electrically coupling some of the multiple pads of the second semiconductor chip and the multiple second leads with multiple wires, respectively; f) sealing the first and second semiconductor chips, parts of the first and second suspension leads, the first and second chip mounting parts, parts of the multiple first and multiple second leads, and multiple wires to form a sealing body that includes a first side extending in a first direction and a second side extending in a second direction substantially perpendicular to the first direction; and g) cutting off the first and second suspension leads and the multiple first and multiple second leads from the lead frame, in which in the first semiconductor chip, multiple first pads and multiple second pads are arranged over its surface, and in the second semiconductor chip, multiple third pads and multiple fourth pads are arranged over its surface, in which the process c) includes the steps of: c1) coupling the multiple first pads of the first semiconductor chip and the multiple fourth pads of the second semiconductor chip with multiple first wires included in a first wire group, respectively; and c2) coupling the multiple second pads of the first semiconductor chip and the multiple third pads of the second semiconductor chip with multiple second wires included in a second wire group, respectively, in which the processes c1) and c2) are performed so that an inter-wire distance between a wire that is closest to the second wire group in the first wire group and a wire that is closest to the first wire group in the second wire group may become larger than any inter-wire distances in the first wire group and the second wire group.

[Clause 2] The method for manufacturing a semiconductor device according to the clause 1, in which the step c1) includes the steps of: c11) forming a first stud bump over one pad among the multiple first pads; and c12) coupling one end of a wire onto one pad among the multiple fourth pads after the step c11); and c13) coupling the other end of the wire onto the first stud bump after the step c12).

[Clause 3] The method for manufacturing a semiconductor device according to the clause 2, in which the step c2) includes the steps of: c21) forming a second stud bump over one pad among the multiple third pads; c22) coupling one end of a wire onto one pad among the multiple second pads after the step c21); and c23) coupling the other end of the wire onto the second stud bump after the step c22).

[Clause 4] The method for manufacturing a semiconductor device according to the clause 1, in which the first and second chip mounting parts have a first end and a second end that faces the first end in the first direction, respectively, in which the first and second suspension leads are coupled to the first ends of the first and second chip mounting parts, respectively, and in which the processes c) to e) are performed with the respective second ends of the first and second chip mounting parts pressed down by a clamper.

[Clause 5] The method for manufacturing a semiconductor device according to the clause 4, in which the second ends of the first and second chip mounting parts are made to be open ends.

[Clause 6] The method for manufacturing a semiconductor device according to the clause 5, comprising the steps of: electrically coupling some of multiple pads of the first semiconductor chip and the first suspension lead with wires; and electrically coupling some of multiple pads of the second semiconductor chip and the second suspension lead with wires.

[Clause 7] The method for manufacturing a semiconductor device according to the clause 5, in which the sealing body has a second side that intersects the first side and extends in the second direction and a fourth side that faces the second side and extends in the second direction, in which the first and second suspension leads are provided so as to be closer to the second side than the fourth side, and in which in the step f), an insulating resin is made to flow from the second side toward the fourth side to form the sealing body.

[Clause 8] The method for manufacturing a semiconductor device according to the clause 7, in which the step f)

includes the steps of: f1) preparing a first mold having a first cavity and a second mold facing the first mold; f2) positioning the lead frame so that the first and second semiconductor chips may be positioned inside the first cavity of the first mold; f3) holding the lead frame with the first mold and the second mold; and f4) making the insulating resin flow into the first cavity from a gate linking to the first cavity.

[Clause 9] The method for manufacturing a semiconductor device according to the clause 4, in which the processes c) to e) are performed with an ultrasonic wave applied to each of the multiple wires through bonding tools.

[Clause 10] The method for manufacturing a semiconductor device according to the clause 1, in which the first and second semiconductor chips are the same semiconductor chip, and in which in the process b), the second semiconductor device is mounted over the second chip mounting part being rotated to the mounting direction of the first semiconductor chip by 180 degrees.

[Clause 11] The method for manufacturing a semiconductor device according to the clause 3, in which an insulating layer is arranged both under a pad over which the first stud bump is formed among the multiple first pads and under a pad over which the second stud bump is formed among the multiple third pads.

[Clause 12] The method for manufacturing a semiconductor device according to the clause 11, in which the insulating layer contains a layer comprised of a polyimide.

[Clause 13] The method for manufacturing a semiconductor device according to the clause 8, in which the depth of the first cavity is a depth so that distances from the wire peaks of respective wires of the first and second wire groups to the upper surface of the sealing body may become equal to or more than the chip thickness of the first semiconductor chip in cross sectional view.

What is claimed is:

1. A semiconductor device, comprising:
   a first semiconductor chip that includes a first transmission part for transmitting a signal to the outside and a first reception part for receiving a signal from the outside, and has a surface over which a plurality of pads are arranged;
   a second semiconductor chip that includes a second transmission part for transmitting a signal to the outside and a second reception part for receiving a signal from the outside, and has a surface over which a plurality of pads are arranged;
   a first chip mounting part having a first upper surface over which the first semiconductor chip is mounted;
   a second chip mounting part having a second upper surface over which the second semiconductor chip is mounted;
   a first suspension lead for supporting the first chip mounting part;
   a second suspension lead for supporting the second chip mounting part;
   a plurality of first leads arranged adjacent to the first chip mounting part;
   a plurality of second leads arranged adjacent to the second chip mounting part;
   a first wire group that mechanically connects the first semiconductor chip and the second semiconductor chip, and contains a plurality of first wires;
   a second wire group that mechanically connects the first semiconductor chip and the second semiconductor chip, and contains a plurality of second wires;
   a third wire group that electrically connects the first semiconductor chip and the first leads, and contains a plurality of third wires;
   a fourth wire group that electrically connects the second semiconductor chip and the second leads, and contains a plurality of fourth wires; and
   a sealing body that includes a first side extending in a first direction and a second side extending in a second direction that is a direction substantially perpendicular to the first direction, and seals the first and second semiconductor chips, the first and second chip mounting parts, parts of the first and second suspension leads, parts of the first leads and the second leads, and the first, second, third, and fourth wires,
   wherein over the surface of the first semiconductor chip, a plurality of first pads electrically connected with the first transmission part and a plurality of second pads electrically connected with the first reception part are arranged,
   wherein the first chip mounting part is not electrically connected with the second chip mounting part,
   wherein over the surface of the second semiconductor chip, a plurality of third pads electrically connected with the second transmission part and a plurality of fourth pads electrically connected with the second reception part are arranged,
   wherein a portion of the first semiconductor chip is not electrically connected with a portion of the second semiconductor chip,
   wherein the first semiconductor chip is not electrically connected with the second chip mounting part,
   wherein the second semiconductor chip is not electrically connected with the first chip mounting part,
   wherein the first pads of the first semiconductor chip and the fourth pads of the second semiconductor chip are electrically connected with one another through the first wire group,
   wherein the second pads of the first semiconductor chip and the third pads of the second semiconductor chip are electrically connected with one another through the second wire group, and
   wherein both in a plan view and along the first direction, an inter-wire distance between one of the plurality of first wires in the first wire group that is closest to the second wire group and one of the plurality of second wires in the second wire group that is closest to the first wire group is larger than respective inter-wire distances between adjacent ones of the plurality of first wires in the first wire group and respective inter-wire distances between adjacent ones of the plurality of second wires in the second wire group, wherein the first transmission part of the first semiconductor chip has first and second coils spaced apart from each other along the first direction in the plan view, wherein a first one of the first pads is surrounded by the first coil in the plan view, wherein a second one of the first pads is surrounded by the second coil in the plan view, wherein a third one of the first pads is disposed between the first and second coils in the plan view.

2. The semiconductor device according to claim 1, wherein the sealing body has a third side opposite the first side;
   wherein in the plan view, the first leads are arranged along the first side;
   wherein in the plan view, the second leads are arranged along the third side;

wherein in the plan view, the first chip mounting part is arranged between the first leads and the second chip mounting part;
wherein in the plan view, the second chip mounting part is arranged between the second leads and the first chip mounting part; and
wherein both in the plan view and along the second direction,
a distance between the first chip mounting part and the second chip mounting part is larger than a distance between the first chip mounting part and the first leads and is larger than a distance between the second chip mounting part and the second leads.

3. The semiconductor device according to claim 2, wherein the first semiconductor chip has:
a first chip side extending in the first direction,
a second chip side that is opposite the first chip side and extends in the first direction,
a third chip side that intersects the first chip side and extends in the second direction, and
a fourth chip side that is opposite the third chip side and extends in the second direction, and
wherein the second pads are arranged so as to be closer to the first chip side of the first semiconductor chip than the first pads are.

4. The semiconductor device according to claim 3,
wherein in the plan view, the first chip side of the first semiconductor chip faces the second chip mounting part,
wherein in the plan view, the second chip side of the first semiconductor chip faces the first leads, and
wherein the second pads are closer than the first pads to the second semiconductor chip.

5. The semiconductor device according to claim 4,
wherein the first and second semiconductor chips are the same semiconductor chip, and
wherein the second semiconductor chip is mounted over the second chip mounting part being rotated to a mounting direction of the first semiconductor chip by 180 degrees.

6. The semiconductor device according to claim 3,
wherein a plurality of fifth pads are arranged along the third chip side over the surface of the first semiconductor chip, and
wherein some pads of the fifth pads are electrically connected with the first upper surface of the first chip mounting part by fifth wires.

7. The semiconductor device according to claim 6,
wherein the first semiconductor chip is mounted over the first upper surface of the first chip mounting part by an adhesive, and
wherein in the plan view, a through hole is provided in a region of the first upper surface located between the first semiconductor chip and a portion where the fifth wires are coupled with the first upper surface of the first chip mounting part.

8. The semiconductor device according to claim 6,
wherein the first suspension lead is arranged along the first side of the sealing body, and
wherein parts of the first leads and a part of the first suspension lead are exposed from the first side of the sealing body.

9. The semiconductor device according to claim 8,
wherein the first suspension lead is a lead to which a ground voltage can be supplied from the outside.

10. The semiconductor device according to claim 6,
wherein one or more pads of the fifth pads to which no wires are coupled are pads to which a power supply voltage can be supplied from the outside.

11. The semiconductor device according to claim 3,
wherein a plurality of sixth pads are arranged along the fourth chip side over the surface of the first semiconductor chip, and
wherein at least one pad of the sixth pads is electrically coupled to a corresponding lead of the first leads by a wire of the third wire group.

12. The semiconductor device according to claim 11,
wherein the lead that is coupled with the at least one pad of the sixth pads is exposed from the first side of the sealing body, and is a lead to which a power supply voltage can be supplied from the outside.

13. The semiconductor device according to claim 12,
wherein one or more pads of the sixth pads to which no wires are coupled are pads to which a ground voltage can be supplied from the outside.

14. The semiconductor device according to claim 1,
wherein in cross sectional view, a distance from a wire peak of each wire of the first and second wire groups to the upper surface of the sealing body is equal to or more than a chip thickness of the first semiconductor chip.

15. The semiconductor device according to claim 3,
wherein the first transmission part includes a transmission circuit, a first coil electrically coupled with the transmission circuit, and a second coil that is arranged over the first coil, is electrically insulated from the first coil via an insulating layer, and is electrically connected with some pads among the first pads, and
wherein in the plan view, each pad coupled with the second coil is arranged so as to be enclosed by the second coil on its periphery.

16. The semiconductor device according to claim 15,
wherein in a cross sectional view, an insulating layer is arranged between the first coil and the second coil.

17. The semiconductor device according to claim 16,
wherein the insulating layer contains a layer comprised of a polyimide.

18. The semiconductor device according to claim 1,
wherein the first reception part includes a reception circuit, and
wherein the reception circuit is electrically coupled with some pads of the second pads.

19. The semiconductor device according to claim 1,
wherein a winding direction of the first coil is opposite to that of the second coil.

20. A semiconductor device comprising:
first and second semiconductor chips, each semiconductor chip having a surface with a plurality of pads thereon, the first semiconductor chip comprising a first transmission part for inductively transmitting a signal to the second semiconductor chip and a first reception part for inductively receiving a signal from the second semiconductor chip, the second semiconductor chip comprising a second transmission part for inductively transmitting a signal to the first semiconductor chip and a second reception part for inductively receiving a signal from the first semiconductor chip;
a plurality of first wires that mechanically connect pads on a first portion of the surface of the first semiconductor chip to pads on a second portion of the surface of the second semiconductor chip;
a plurality of second wires that mechanically connect pads on a second portion of the surface of the first semiconductor chip to pads on a first portion of the surface of second semiconductor chip; and a sealing body that seals the first and second semiconductor chips and the pluralities of first and second wires, wherein the pads on the first and second portions of the surfaces of the first and second semiconductor chips are mechanically connected to one of the first transmission part, the second transmission part, the first reception part, and the second reception part, wherein a portion of the first semiconductor chip is not electrically connected with a portion of the second semiconductor chip, wherein the first semiconductor chip operates with a power supply voltage that is different from that of the second semiconductor chip, and wherein in a plan view, a minimum distance between the plurality of first wires and the plurality of second wires is greater than a respective spacing between adjacent pairs of the plurality of first wires and is greater than a respective spacing between adjacent pairs of the plurality of second wires, wherein the first transmission part of the first semiconductor chip comprises: a first transmission circuit of the first semiconductor chip; a first coil of the first semiconductor chip electrically connected with the first transmission circuit; and a second coil of the first semiconductor chip disposed over the first coil and electrically insulated from the first coil, the second coil being electrically connected with the second reception part of the second semiconductor chip, wherein the second transmission part of the second semiconductor chip comprises: a second transmission circuit of the second semiconductor chip; a third coil of the second semiconductor chip electrically connected with the second transmission circuit; and a fourth coil of the second semiconductor chip disposed over the third coil and electrically insulated from the third coil, the fourth coil being electrically connected with the first reception part of the first semiconductor chip, wherein one of the pads connected with the second coil is surrounded by the second coil in a plan view, wherein one of the pads connected with the fourth coil is surrounded by the fourth coil in the plan view, wherein a first insulating layer is disposed between the surface of the first semiconductor chip and the second coil, and wherein a second insulating layer is disposed between the surface of the second semiconductor chip and the fourth coil.

* * * * *